(12) United States Patent
Kang et al.

(10) Patent No.: US 12,048,156 B2
(45) Date of Patent: Jul. 23, 2024

(54) VERTICAL MEMORY DEVICES AND METHODS OF MANUFACTURING THE SAME

(71) Applicant: SAMSUNG ELECTRONICS CO., LTD., Suwon-si (KR)

(72) Inventors: Shin-Hwan Kang, Suwon-si (KR); Sun-Il Shim, Seoul (KR); Seung Hyun, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 339 days.

(21) Appl. No.: 17/450,726

(22) Filed: Oct. 13, 2021

(65) Prior Publication Data
US 2022/0028740 A1    Jan. 27, 2022

Related U.S. Application Data

(63) Continuation of application No. 16/354,448, filed on Mar. 15, 2019, now Pat. No. 11,171,151.

(30) Foreign Application Priority Data

Aug. 3, 2018    (KR) .................... 10-2018-0090766

(51) Int. Cl.
*H10B 43/27*    (2023.01)
*H01L 23/535*    (2006.01)
(Continued)

(52) U.S. Cl.
CPC .......... *H10B 43/27* (2023.02); *H01L 23/535* (2013.01); *H01L 29/4234* (2013.01); *H01L 29/456* (2013.01); *H10B 43/40* (2023.02)

(58) Field of Classification Search
CPC ....... H10B 43/27; H10B 43/40; H01L 23/535; H01L 29/456
See application file for complete search history.

(56) References Cited

U.S. PATENT DOCUMENTS 8,476,713 B2    7/2013 Lee et al.
9,337,207 B2    5/2016 Park et al.
(Continued)

FOREIGN PATENT DOCUMENTS

CN    104979313 A    10/2015
CN    107799529 A    3/2018
(Continued)

OTHER PUBLICATIONS

1 Office Action dated Jan. 18, 2024 in related Korean Patent Application No. 10-2018-0090766 (8 pages), in Korean.
(Continued)

*Primary Examiner* — Trang Q Tran
(74) *Attorney, Agent, or Firm* — F. CHAU & ASSOCIATES, LLC

(57) ABSTRACT

A vertical memory device includes first gate electrodes stacked on a cell region of a substrate and spaced apart from each other in a vertical direction substantially perpendicular to an upper surface of the substrate, a channel extending through the first gate electrodes and extending in the vertical direction, a first contact plug structure contacting a corresponding one of the first gate electrodes, extending in the vertical direction, and including a first metal pattern, a first barrier pattern covering a lower surface and a sidewall of the first metal pattern and a first metal silicide pattern covering a lower surface and a sidewall of the first barrier pattern, and a second contact plug structure extending in the vertical direction on a peripheral circuit region of the substrate and including a second metal pattern and a second barrier pattern covering a lower surface and a sidewall of the second metal pattern.

20 Claims, 23 Drawing Sheets

(51) Int. Cl.
*H01L 29/423* (2006.01)
*H01L 29/45* (2006.01)
*H10B 43/40* (2023.01)

(56) References Cited

U.S. PATENT DOCUMENTS

| | | | |
|---|---|---|---|
| 9,401,309 B2 | 7/2016 | Izumi et al. |
| 9,524,983 B2 | 12/2016 | Lee et al. |
| 9,728,549 B2 | 8/2017 | Yun et al. |
| 9,735,014 B2 | 8/2017 | Jung et al. |
| 9,865,540 B2 | 1/2018 | Kim et al. |
| 2010/0207240 A1 | 8/2010 | Hashimoto et al. |
| 2010/0320526 A1 | 12/2010 | Kidoh et al. |
| 2014/0021632 A1 | 1/2014 | Lee et al. |
| 2014/0036567 A1 | 2/2014 | Fukuzumi et al. |
| 2015/0115345 A1 | 4/2015 | Nowak et al. |
| 2015/0287710 A1 | 10/2015 | Yun et al. |
| 2015/0372004 A1 | 12/2015 | Jung et al. |
| 2017/0062473 A1 | 3/2017 | Lee et al. |
| 2017/0077026 A1 | 3/2017 | Okawa et al. |
| 2017/0077120 A1 | 3/2017 | Sawabe et al. |
| 2017/0084532 A1 | 3/2017 | Son et al. |
| 2017/0103993 A1 | 4/2017 | Lee et al. |
| 2017/0117222 A1* | 4/2017 | Kim ................... H01L 23/5283 |
| 2017/0117225 A1 | 4/2017 | Adusumilli et al. |
| 2017/0148677 A1 | 5/2017 | Shin |
| 2020/0043943 A1 | 2/2020 | Kang et al. |
| 2023/0019121 A1 | 1/2023 | Flaherty et al. |

FOREIGN PATENT DOCUMENTS

| | | |
|---|---|---|
| JP | 2010-192646 A2 | 9/2010 |
| KR | 10-0140727 | 3/1998 |
| KR | 10-1998-0056170 | 9/1998 |
| KR | 10-0669108 | 1/2007 |
| KR | 10-2009-0054739 A | 6/2009 |
| KR | 10-2010-0137349 | 12/2010 |
| KR | 10-2016-0109986 | 9/2016 |
| KR | 10-2017-0056093 | 5/2017 |
| KR | 10-2017-0061232 | 6/2017 |

OTHER PUBLICATIONS

Office Action dated Nov. 23, 2023 for related Chinese Patent Application No. 201910530079.1, in Chinese, 11 pages.
Grant Notice dated May 16, 2024 in corresponding Chinese Patent Application No. 201910530079.1 (in Chinese), 4 pages.

* cited by examiner

VERTICAL MEMORY DEVICES AND METHODS OF MANUFACTURING THE SAME

CROSS-REFERENCE TO RELATED APPLICATION

This application is a continuation of U.S. application Ser. No. 16/354,448, filed on Mar. 15, 2019, which claims priority under 35 U.S.C. § 119 to Korean Patent Application No. 10-2018-0090766, filed on Aug. 3, 2018, in the Korean Intellectual Property Office (KIPO), the contents of which are herein incorporated by reference in their entirety.

TECHNICAL FIELD

Example embodiments of the present inventive concept relate to a vertical memory device and a method of manufacturing the same.

DISCUSSION OF RELATED ART

In a process of fabricating a vertical NAND (VNAND) flash memory device, holes may be formed to expose gate electrodes on a cell region of a substrate, and metal patterns may fill the holes to form contact plugs, which may be connected to the gate electrodes, respectively. However, when the thicknesses of the gate electrodes are small, the holes may penetrate through the gate electrodes.

SUMMARY

Example embodiments of the present inventive concept provide a vertical memory device having enhanced electrical characteristics and a method of manufacturing the same.

According to an example embodiment of the present inventive concept, there is provided a vertical memory device. The vertical memory device may include first gate electrodes stacked on a cell region of a substrate including the cell region and a peripheral circuit region, the first gate electrodes being spaced apart from each other in a vertical direction substantially perpendicular to an upper surface of the substrate, a channel extending through ones of the first gate electrodes and extending in the vertical direction, a first contact plug structure contacting a corresponding one of the first gate electrodes and extending in the vertical direction, the first contact plug structure including a first metal pattern, a first barrier pattern covering a lower surface and a sidewall of the first metal pattern and a first metal silicide pattern covering a lower surface and a sidewall of the first barrier pattern, and a second contact plug structure extending in the vertical direction on the peripheral circuit region of the substrate, the second contact plug structure including a second metal pattern and a second barrier pattern covering a lower surface and a sidewall of the second metal pattern.

According to an example embodiment of the present inventive concept, there is provided a vertical memory device. The vertical memory device may include gate electrodes stacked on a substrate, the gate electrodes being spaced apart from each other in a vertical direction substantially perpendicular to an upper surface of the substrate, a channel extending through ones of the gate electrodes and extending in the vertical direction, a first contact plug structure contacting a corresponding one of the gate electrodes and extending in the vertical direction, the first contact plug structure including a first metal pattern, a first metal nitride pattern covering a lower surface and a sidewall of the first metal pattern and a first metal silicide pattern covering a lower surface and a sidewall of the first metal nitride pattern. A lower surface of the first contact plug structure is higher than a lower surface of the corresponding one of the gate electrodes.

According to an example embodiment of the present inventive concept, there is provided a vertical memory device. The vertical memory device may include a circuit pattern disposed on a substrate including a cell region and a peripheral region, an insulating interlayer covering the circuit pattern, a base pattern disposed on the insulating interlayer on the cell region of the substrate, gate electrodes disposed on the base pattern, the gate electrodes being spaced apart from each other in a vertical direction substantially perpendicular to an upper surface of the substrate, a channel extending through ones of the gate electrodes in the vertical direction, a first contact plug structure contacting a corresponding one of the gate electrodes and extending in the vertical direction, the first contact plug structure including a first metal pattern, a first barrier pattern covering a lower surface and a sidewall of the first metal pattern and a first metal silicide pattern covering a lower surface and a sidewall of the first barrier pattern, and a second contact plug structure disposed on the peripheral region of the substrate, the second contact plug structure extending in the vertical direction to be electrically connected to the circuit pattern and including a second metal pattern and a second barrier pattern covering a lower surface and a sidewall of the second metal pattern.

According to an example embodiment of the present inventive concept, there is provided a method of manufacturing a vertical memory device. The method may include forming a gate electrode structure covered by an insulating interlayer and including first gate electrodes, which are formed on a cell region of a substrate including the cell region and a peripheral circuit region and are spaced apart from each other in a vertical direction substantially perpendicular to an upper surface of the substrate, forming first contact holes extending through the insulating interlayer in the vertical direction to expose portions of the first gate electrodes, respectively, forming a polysilicon layer on the exposed portions of the first gate electrodes, sidewalls of the first contact holes, and the insulating interlayer, forming a second contact hole extending through the insulating interlayer in the vertical direction on the peripheral circuit region of the substrate, forming a barrier layer on the polysilicon layer, an inner wall of the second contact hole, and the insulating interlayer, performing a heat treatment so that the barrier layer and the polysilicon layer may react with each other to form a metal silicide layer, and forming first and second metal patterns to fill remaining portions of the first and second contact holes, respectively.

According to an example embodiment of the present inventive concept, there is provided a method of manufacturing a vertical memory device. The method may include forming a gate electrode structure covered by an insulating interlayer and including gate electrodes, which are formed on a substrate and spaced apart from each other in a vertical direction substantially perpendicular to an upper surface of the substrate, forming contact holes extending through the insulating interlayer in the vertical direction to expose portions of the gate electrodes, respectively, forming a polysilicon layer on the exposed portions of the gate electrodes, sidewalls of the contact holes, and the insulating interlayer, forming a barrier layer on the polysilicon layer, performing a heat treatment so that the barrier layer and the polysilicon layer may react with each other to form a metal silicide layer, and forming first metal patterns to fill remaining portions of the contact holes, respectively.

According to an example embodiment of the present inventive concept, there is provided a method of manufacturing a vertical memory device. The method may include forming a circuit pattern on a substrate including a cell region and a peripheral region, forming a first insulating interlayer to cover the circuit pattern, forming a base pattern on a portion of the first insulating interlayer on the cell region of the substrate, forming a gate electrode structure covered by a second insulating interlayer on the first insulating interlayer and including gate electrodes, which are formed on the cell region of the substrate and are spaced apart from each other in a vertical direction substantially perpendicular to an upper surface of the substrate, forming first contact holes extending through the second insulating interlayer in the vertical direction to expose portions of the gate electrodes, respectively, forming a polysilicon layer on the exposed portions of the gate electrode, sidewalls of the first contact holes, and the second insulating interlayer, forming a second contact hole extending through the first and second insulating interlayer in the vertical direction on the peripheral region of the substrate to expose a portion of the circuit pattern, forming a barrier layer on the polysilicon layer, the exposed portion of the circuit pattern, a sidewall of the second contact hole, and the second insulating interlayer, performing a heat treatment so that the barrier layer and the polysilicon layer may react with each other to form a metal silicide layer, and forming first and second metal patterns to fill remaining portions of the first and second contact holes, respectively.

In a vertical memory device in accordance with an example embodiment of the present inventive concept, contact plugs formed to contact each of gate electrodes stacked in a vertical direction may be formed in the corresponding gate electrodes without extending through the corresponding gate electrodes, the contact resistance may be reduced, and electrical short between the gate electrodes formed on different levels may be prevented.

BRIEF DESCRIPTION OF THE DRAWINGS

Example embodiments of the present inventive concept will be more clearly understood from the following detailed description taken in conjunction with the accompanying drawings, in which.

Figure 1:
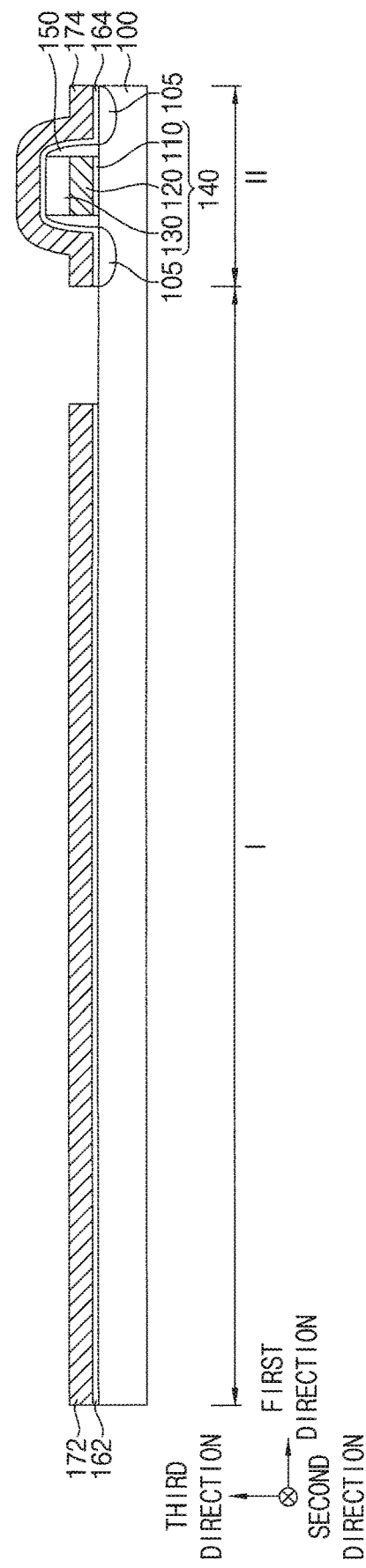
FIGS. 1 to 14 are cross-sectional views illustrating a method of manufacturing a vertical memory device in accordance with an example embodiment of the present inventive concept.

Since the drawings in FIGS. 1-23 are intended for illustrative purposes, the elements in the drawings are not necessarily drawn to scale. For example, some of the elements may be enlarged or exaggerated for clarity purpose.

DETAILED DESCRIPTION OF THE EMBODIMENTS

Example embodiments of the present inventive concept will be more clearly understood from the following detailed description taken in conjunction with the accompanying drawings.

FIGS. 1 to 14 are cross-sectional views illustrating a method of manufacturing a vertical memory device in accordance with an example embodiment of the present inventive concept. FIGS. 11 and 13 are enlarged cross-sectional views of X regions of FIGS. 10 and 12, respectively.

Hereinafter, two directions intersecting with each other among horizontal directions substantially parallel to an upper surface of a substrate are defined as first and second directions, respectively, and a vertical direction substantially perpendicular to the upper surface of the substrate is defined as a third direction. In an example embodiment of the present inventive concept, the first and second directions may be orthogonal to each other. The third direction may be substantially perpendicular to the first and second directions.

Referring to FIG. 1, a gate structure 140 may be formed on a second region II of a substrate 100 including a first region I and the second region II. In an example embodiment of the present inventive concept, the first region I may be referred to as a cell region and the second region II may be referred to as a peripheral circuit region.

The substrate 100 may include group IV semiconductor materials, e.g., silicon (Si), germanium (Ge), silicon-germanium (SiGe), etc., or III-V compounds e.g., gallium phosphide (GaP), gallium arsenide (GaAs). Gallium Antimonide (GaSb), etc. In an example embodiment of the present inventive concept, the substrate 100 may be a silicon-on-insulator (SOI) substrate or a germanium-on-insulator (GOI) substrate.

The gate structure 140 may be formed by sequentially stacking a gate insulation layer, a gate electrode layer and a gate mask layer on the substrate 100, and patterning the gate insulation layer, the gate electrode layer and the gate mask layer. The gate insulation layer, the gate electrode layer and the gate mask layer may each be formed by a chemical vapor deposition (CVD) process, an atomic layer deposition (ALD) process, a physical vapor deposition (PVD) process, or the like. The patterning of the gate insulation layer, the gate electrode layer and the gate mask layer may include a photolithography process and an anisotropic etching process. Accordingly, the gate structure 140 may include a gate insulation pattern 110, a second gate electrode 120 and a gate mask 130 sequentially stacked on the substrate 100. The gate insulation pattern 110 may include an oxide, e.g., silicon oxide ($SiO_2$), the second gate electrode 120 may include a metal, e.g., tungsten (W), titanium (Ti), aluminum (Al), etc., and/or doped polysilicon, and the gate mask 130 may include a nitride, e.g., silicon nitride ($Si_3Na$). Alternatively, the gate insulation pattern 110 may include a material having a dielectric constant greater than that of a silicon oxide ($SiO_2$), for example, having a dielectric constant of about 10 to about 25, and may include a metal oxide, e.g., hafnium oxide ($HfO_2$), tantalum oxide ($Ta_2O_5$), zirconium oxide ($ZrO_2$), etc.

A gate spacer 150 may be formed on a sidewall of the gate structure 140. The gate spacer 150 may be formed by forming a gate spacer layer to conformally cover the gate structure 140, and anisotropically etching the gate spacer layer. The gate spacer 150 may include a nitride. e.g., silicon nitride ($Si_3N_4$), and thus may be merged with the gate mask 130. After forming the gate spacer 150, impurities may be implanted into an upper portion of the substrate 100 adjacent to the gate structure 140 to form a first impurity region 105. The first impurity region 105 may include n-type impurities or p-type impurities, and together with the gate structure 140 may form a transistor. The first impurity region 105 may serve as a source/drain region of the transistor.

After sequentially forming a first insulation layer and an etch stop layer on the substrate 100 to cover the gate structure 140 and the gate spacer 150, the first insulation layer and the etch stop layer may be patterned to respectively form a first insulation pattern 162 and a first sacrificial pattern 172 sequentially stacked on the first region I of the substrate 100, and to respectively form a second insulation pattern 164 and an etch stop pattern 174 sequentially stacked on the second region II of the substrate 100.

In an example embodiment of the present inventive concept, the first insulation pattern 162 and the first sacrificial pattern 172 may be formed to have a rectangular shape on the first region I of the substrate 100 in a plan view, and the second insulation pattern 164 and the etch stop pattern 174 may be formed to cover the gate structure 140 and the gate spacer 150 on the second region II of the substrate 100 in a plan view. Also, the second insulation pattern 164 and the etch stop pattern 174 formed may cover the first impurity region 105 on the second region II of the substrate 100.

The first insulation layer may include an oxide, e.g., silicon oxide ($SiO_2$), and the etch stop layer may include a nitride, e.g., silicon nitride ($Si_3N_4$).

Figure 2:
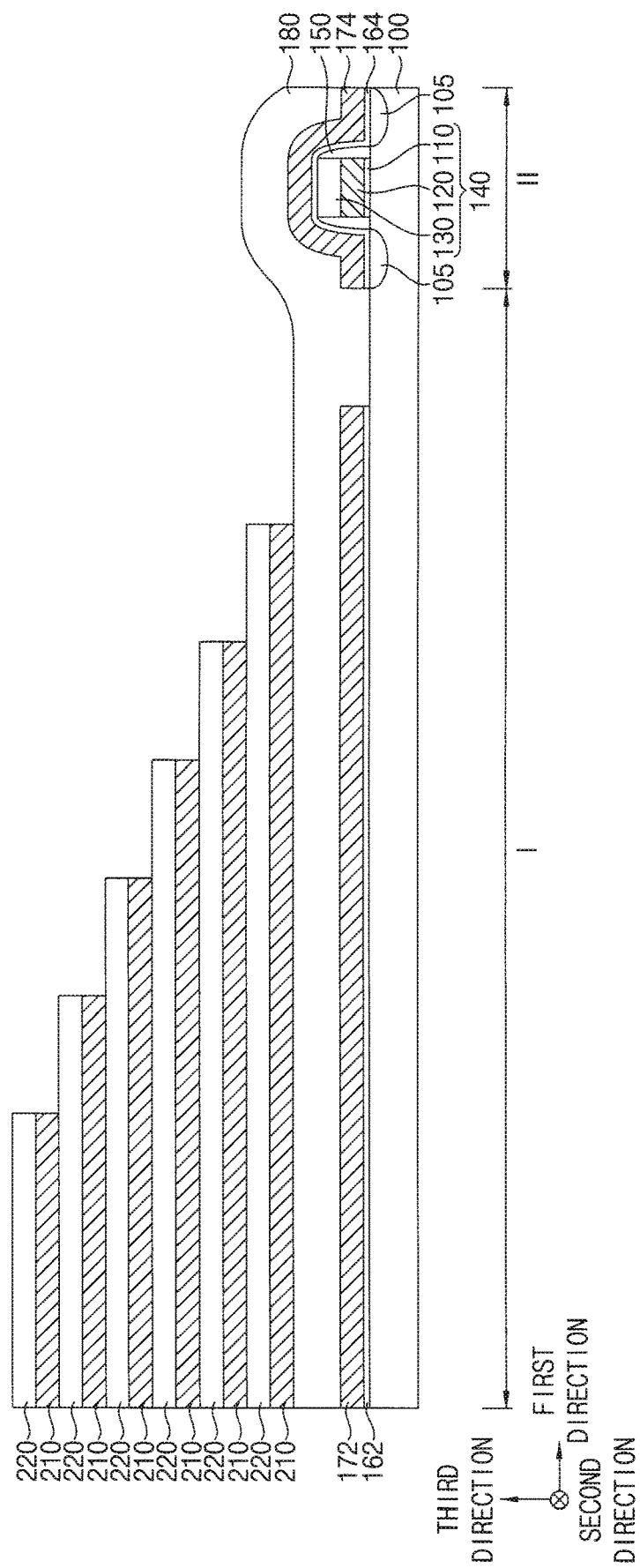

Referring to FIG. 2, a first insulating interlayer 180 may be formed on the substrate 100 to cover the first and second insulation patterns 162 and 164, the first sacrificial pattern 172, and the etch stop pattern 174.

The first insulating interlayer 180 may include an oxide, e.g., silicon oxide ($SiO_2$). In an example embodiment of the present inventive concept, the first insulating interlayer 180 may include first and second layers sequentially stacked, which may include, e.g., high density plasma (HDP) oxide and tetra ethyl ortho silicate (TEOS), respectively.

A sacrificial layer and a second insulation layer may be alternately and repeatedly stacked on the first insulating interlayer 180. Accordingly, a plurality of sacrificial layers and a plurality of second insulation layers may be alternately stacked in the third direction. FIG. 2 illustrates that six levels of sacrificial layers and six levels of second insulation layers are alternately formed, however, the present inventive concept may not be limited thereto. For example, the number of the sacrificial layer and the number of the second insulation layer may be greater or smaller than six.

The second insulation layer and the sacrificial layer may be formed by a process, e.g., a CVD process, a plasma enhanced chemical vapor deposition (PECVD) process, an ALD process, etc. The second insulation layer may include a silicon oxide ($SiO_2$), e.g., TEOS, HDP oxide or polyethyleneoxide (PEOX), etc., and the sacrificial layer may include a material having an etching selectivity with respect to the second insulation layer, e.g., silicon nitride ($Si_3N_4$).

A photoresist pattern may be formed by a photolithography process on an uppermost one of the second insulation layers to partially cover the uppermost one of the second insulation layers, and the uppermost one of the second insulation layers and an uppermost one of the sacrificial layers may be etched using the photoresist pattern as an etching mask. Accordingly, a portion of the second insulation layer under the uppermost one of the sacrificial layers may be exposed. After reducing an area of the photoresist pattern by a given ratio through a trimming process, the uppermost one of the second insulation layers, the uppermost one of the sacrificial layers, the exposed one of the second insulation layers and one of the sacrificial layers thereunder may be etched again by an etching process using the reduced photoresist pattern as an etching mask. The trimming process and the etching process may be alternately and repeatedly performed so that a mold that may include a plurality of steps including a second sacrificial pattern 210 and a third insulation pattern 220 sequentially stacked may be formed on the first region I of the substrate 100, and an upper surface of the first insulating interlayer 180 may be exposed on the second region II of the substrate 100. Thus, each of the plurality of steps may include not only an exposed portion, but also a portion covered by upper level steps.

In an example embodiment of the present inventive concept, the steps in the mold may have areas decreasing by a given rate from a lowermost level toward an uppermost level thereof. A lowermost one of the steps in the mold may also have an area smaller than that of a step including the first insulation pattern 162 and the first sacrificial pattern 172 in a plan view. The steps included in the mold may have lengths extending in the first direction, and the lengths may gradually decrease from a lowermost one toward an uppermost one thereof.

Figure 3:
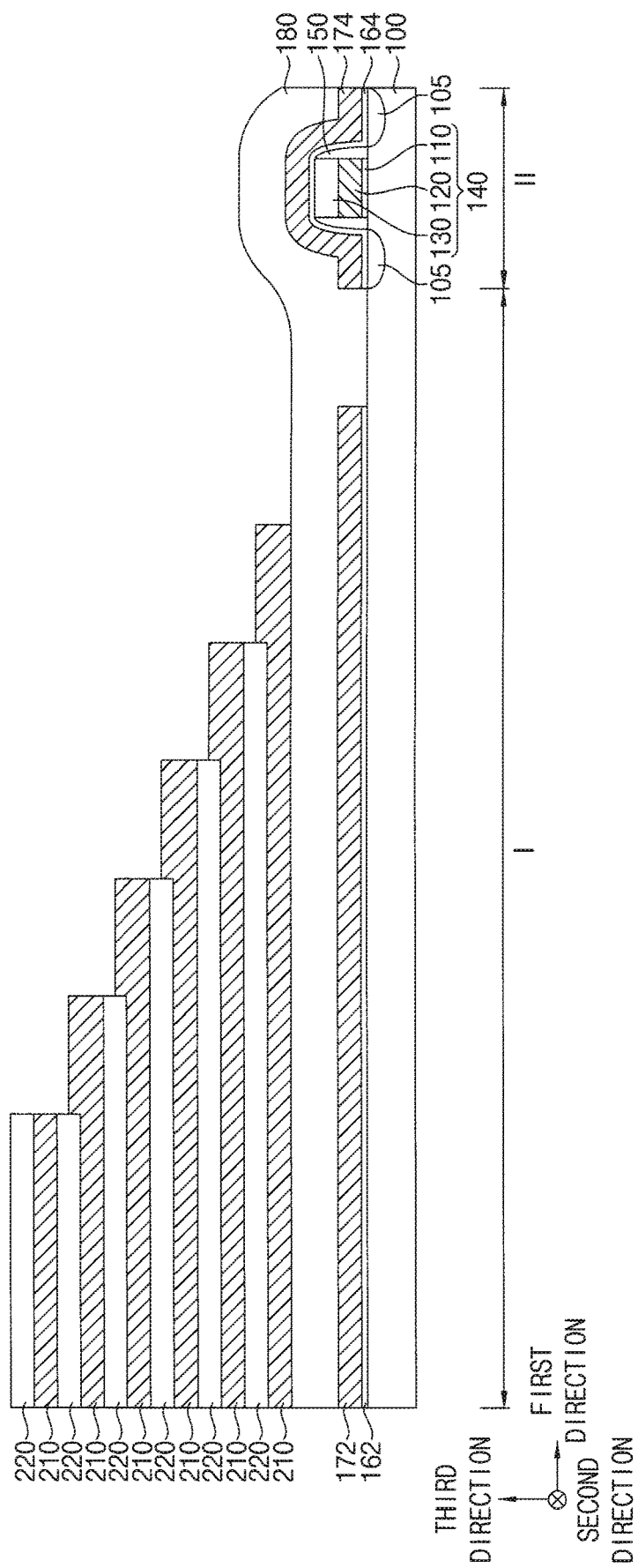

Referring to FIG. 3, a thickness of each of end portions in the first direction of ones of the second sacrificial patterns 210 may be increased.

In an example embodiment of the present inventive concept, an end portion of the third insulation pattern 220 in an exposed portion of each of the steps of the mold, which may not be covered by upper steps, may be removed to expose an end portion of the second sacrificial pattern 210 in the exposed portion thereof. Then, a material substantially the same as that of the second sacrificial pattern 210 may be further deposited on the exposed end portion of the second sacrificial pattern 210 to increase the thickness of each of the end portions of the ones of the second sacrificial patterns 210. Accordingly, each of the end portions in the first direction of the ones of the second sacrificial patterns 210 may have an upper surface higher than those of other portions thereof, and may have a relatively greater thickness.

FIG. 3 illustrates that the thickness of each of the end portions of all the second sacrificial patterns 210 except for the uppermost one of the second sacrificial patterns 210 is increased, however, the present inventive concept may not be limited thereto, and for example, the thickness of each of the end portions of all the second sacrificial patterns 210 with no exception may be increased.

Figure 4:
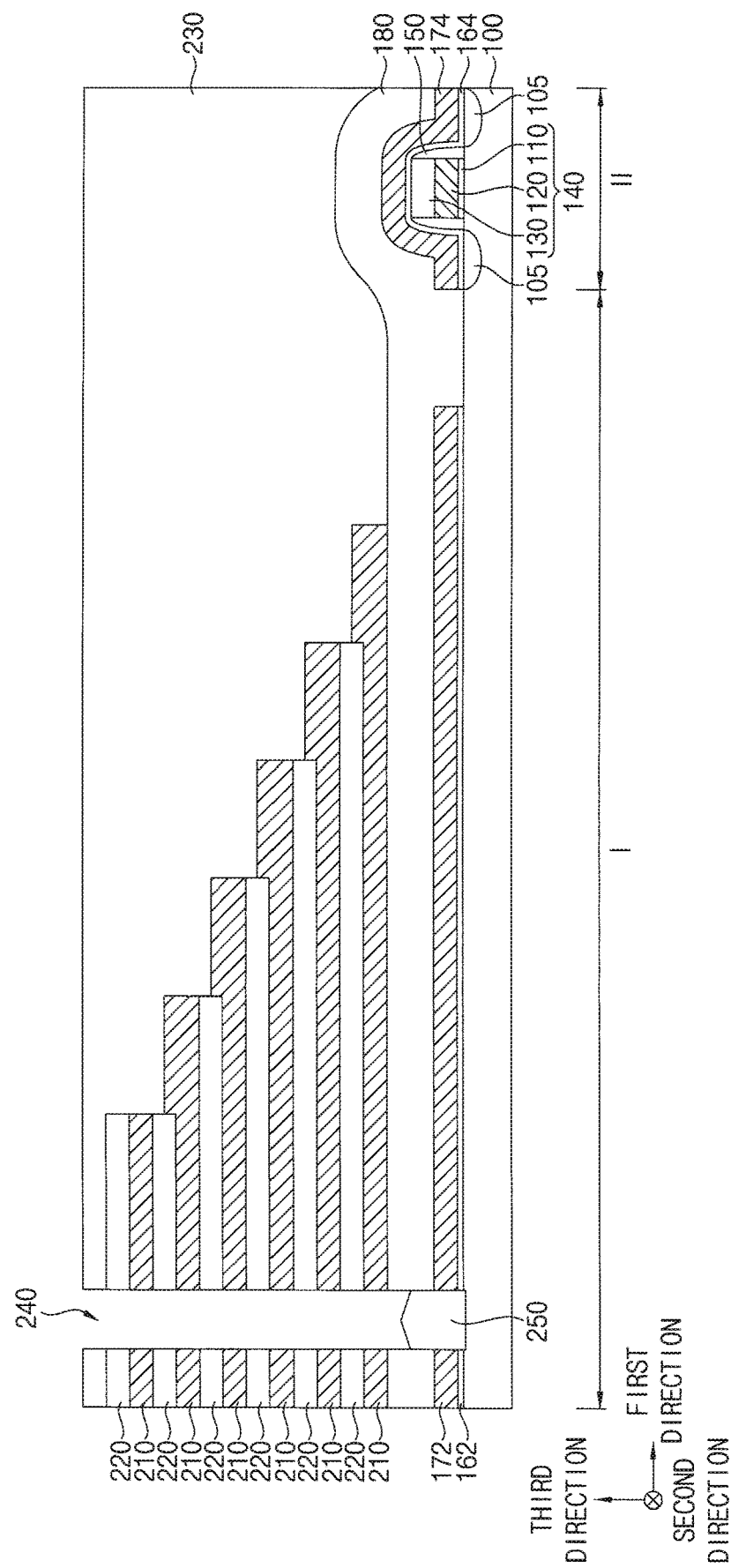

Referring to FIG. 4, a second insulating interlayer 230 may be formed on the first insulating interlayer 180 to cover the mold, and a planarization process may be performed on an upper portion of the second insulating interlayer 230. The second insulating interlayer 230 may include, for example, silicon oxide ($SiO_2$), and thus may be merged with the first insulating interlayer 180.

The planarization process may include, e.g., a chemical mechanical polishing (CMP) process and/or an etch back process, and may be performed until an upper surface of an uppermost one of the third insulation patterns 220 is exposed, or may be performed up to a height higher than that of the upper surface of the uppermost one of the third insulation patterns 220.

After forming a first mask on the second insulating interlayer 230, the second insulating interlayer 230, the third insulation patterns 220, the second sacrificial patterns 210, the first insulating interlayer 180, the first sacrificial pattern 172 and the first insulation pattern 162 may be etched using the first mask as an etching mask to form a channel hole 240 extending therethrough and exposing the first region I of the substrate 100.

The first mask may include, e.g., an amorphous carbon layer (ACL), a spin-on-hard mask (SOH), a photoresist pattern, etc. The formation of the first mask may include a photolithography process, and may additionally include an anisotropic etching process.

In an example embodiment of the present inventive concept, the channel hole 240 may be formed by an anisotropically etching process, and a top surface of the first region I of the substrate 100 under the channel hole 240 may be recessed by over-etching. In other words, bottom surface of the channel hole 240 may be lower than the top surface of the first region I of the substrate 100. However, the present inventive concept may not be limited thereto. For example, the first region I of the substrate 100 under the channel hole 240 may not be over-etched.

A plurality of channel holes 240 may be formed in each of the first and second directions to form a channel hole array.

A selective epitaxial growth (SEG) process using the upper surface of the substrate 100 exposed by the channel hole 240 as a seed may be performed to form an epitaxial layer 250 partially filling the channel hole 240.

In an example embodiment of the present inventive concept, the SEG process may be performed using a silicon source gas, an etching gas and a carrier gas, and thus a single crystalline silicon layer may be formed as the epitaxial layer 250.

In the SEG process, the silicon source gas may include e.g., silane ($SiH_4$) gas, disilane ($Si_2H_6$) gas, dichloro silane ($SiH_2Cl_2$) gas, etc., the etching gas may include e.g., hydrogen chloride (HCl) gas, and the carrier gas may include e.g., hydrogen ($H_2$) gas.

In an example embodiment of the present inventive concept, the epitaxial layer 250 may be doped. For example, when the first region I of the substrate 100 under the channel hole 240 is doped, the epitaxial layer 250 may also be doped and may include a semiconductor material having a conductivity type the same as that of the first region I of the substrate 100 under the channel hole 240.

In an example embodiment of the present inventive concept, an upper surface of the epitaxial layer 250 may be higher than a lower surface of the first insulating interlayer 180, and may be lower than the upper surface of the first insulating interlayer 180.

Figure 5:
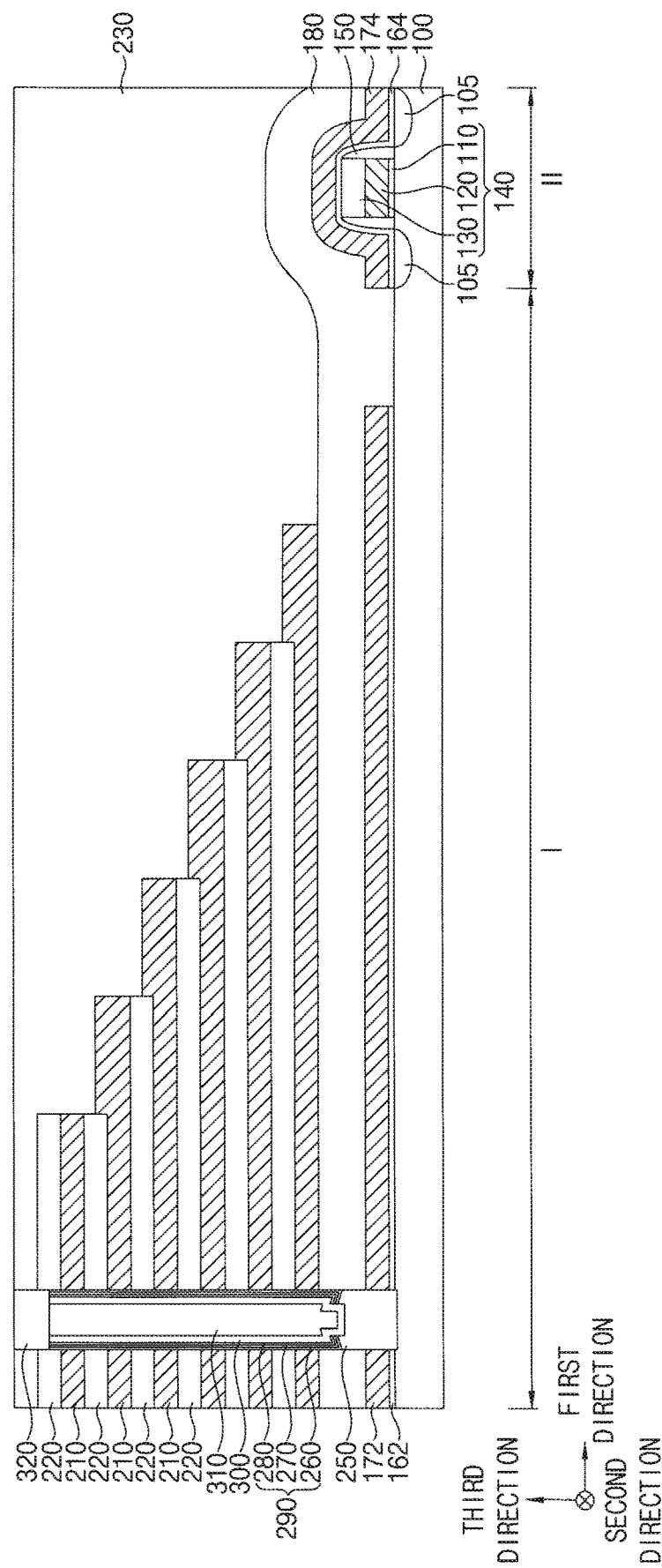

Referring to FIG. 5, after the first mask is removed, a first blocking layer, a charge storage layer, a tunnel insulation layer and a first spacer layer may be sequentially formed on a sidewall of the channel hole 240, the upper surface of the epitaxial layer 250 and an upper surface of the second insulating interlayer 230. The first blocking layer, the charge storage layer, the tunnel insulation layer and the first spacer layer may be conformally formed to have thicknesses that do not completely fill each of the channel holes 240, and may be formed by, for example, an ALD process and/or a CVD process. Then, the first spacer layer may be anisotropically etched to form a first spacer remaining only on the sidewall of the channel hole 240, and the tunnel insulation layer, the charge storage layer and the first blocking layer may be etched using the first spacer as an etching mask to form a tunnel insulation pattern 280, a charge storage pattern 270 and a first blocking pattern 260 having a cup-like shape, of which a central lower portion is opened, on the sidewall of the channel hole 240. During the etching process, an upper portion of the epitaxial layer 250 may also be partially removed together with the first mask. The etching process may be a vertical dry etching process such as, for example, reactive ion etching (RIE) process. The tunnel insulation pattern 280, the charge storage pattern 270 and the first blocking pattern 260 altogether may form a charge storage structure 290.

The tunnel insulation pattern 280 and the first blocking pattern 260 may include an oxide, e.g., silicon oxide ($SiO_2$), and the charge storage pattern 270 may include a nitride, e.g., silicon nitride ($Si_3N_4$).

After removing the first spacer, a channel layer may be formed on the exposed epitaxial layer 250, the tunnel insulation pattern 280 and the second insulating interlayer 230, and then a filling layer may be formed on the channel layer to sufficiently fill a remaining portion of each of the channel holes 240. The channel layer may be formed by, for example, an ALD process and/or a CVD process. The filling layer may be formed by a spin-on-glass (SOG) technique.

The channel layer may include doped or undoped polysilicon or amorphous silicon (Si), and the filling layer may include an oxide, e.g., silicon oxide ($SiO_2$). When the channel layer is formed to include amorphous silicon (Si), a laser epitaxial growth process or a solid phase epitaxy process may be further performed to transform the channel layer into crystalline silicon (Si).

The filling layer and the channel layer may be planarized until the upper surface of the second insulating interlayer 230 is exposed, so that a filling pattern 310 may be formed to fill the remaining portion of each of the channel holes 240, and the channel layer may be transformed into a channel 300.

Accordingly, the charge storage structure 290, the channel 300 and the filling pattern 310 may be sequentially stacked on the epitaxial layer 250 in each of the channel holes 240. The charge storage structure 290 may be formed to have a cup-like shape of which a central lower portion is opened, the channel 300 may be formed to have a cup-like shape, and the filling pattern 310 may be formed to have a pillar-like shape.

As the channel holes 240 in which the channels 300 are respectively formed may form the channel hole array, the channels 300 may also form a channel array corresponding thereto.

An upper portion of a first structure including the filling pattern 310, the channel 300 and the charge storage structure 290 may be removed to form a trench, and a capping pattern 320 may be formed to fill the trench.

For forming the capping pattern 320, after forming the trench by performing an etch back process to remove the upper portion of the first structure, a capping layer may be formed on the first structure and the second insulating interlayer 230 to fill the trench, then an upper portion of the capping layer may be planarized until the upper surface of the second insulating interlayer 230 is exposed to form the capping pattern 320. In an example embodiment of the present inventive concept, the capping layer may be formed to include doped or undoped polysilicon or amorphous silicon (Si), and when the capping layer is formed to include amorphous silicon (Si), a process of crystallizing the capping layer may be further performed.

The first structure, the epitaxial layer 250 and the capping pattern 320 in each of the channel holes 240 may define a second structure.

Figure 6:
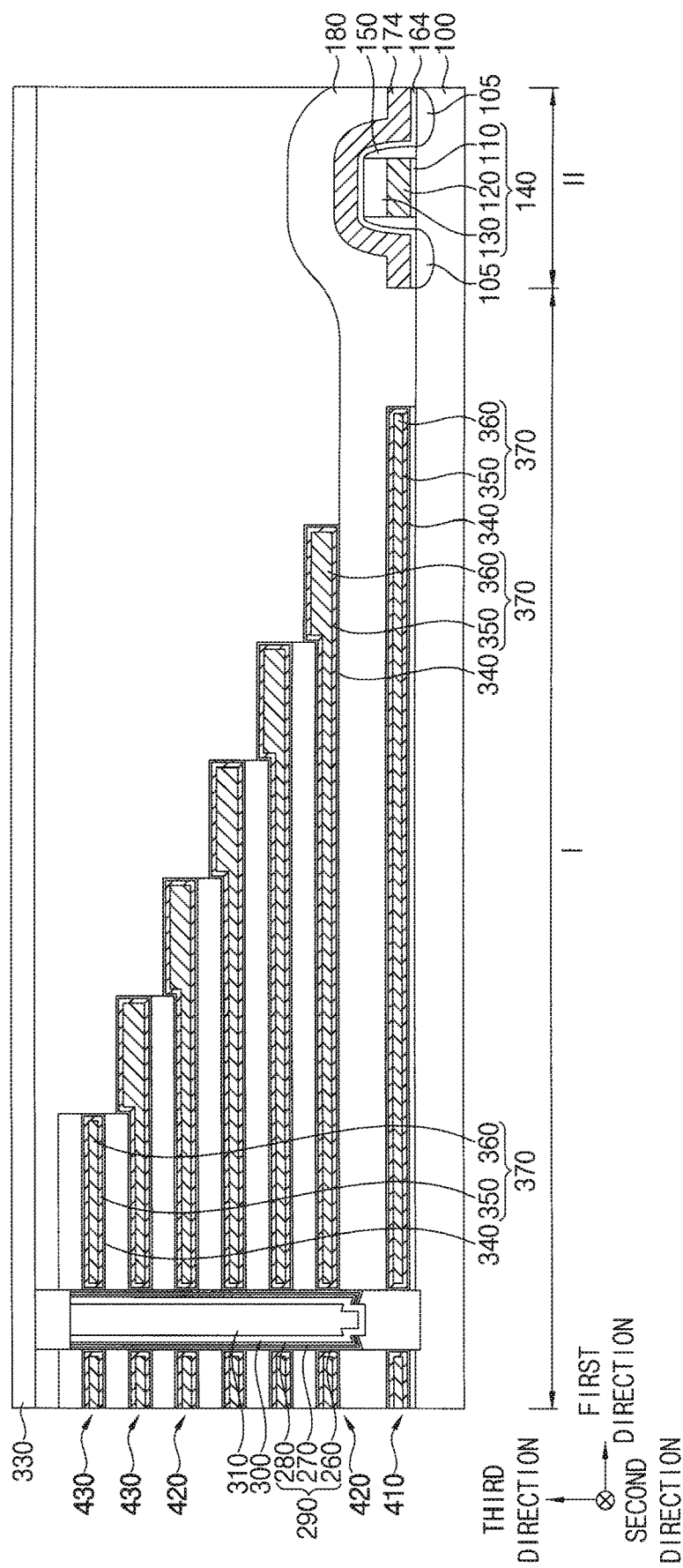

Referring to FIG. 6, a third insulating interlayer 330 may be formed on the second insulating interlayer 230 and the capping pattern 320. After forming a second mask on the third insulating interlayer 330, a first opening extending through the third insulating interlayer 330, the second insulating interlayer 230, the third insulation patterns 220, the second sacrificial patterns 210, the first insulating interlayer 180, the first sacrificial pattern 172 and the first insulation pattern 162 may be formed using the second mask as an etching mask to expose the upper surface of the substrate 100. The second mask may include a material the same as that of the first mask. The third insulating interlayer 330 may include an oxide, e.g., silicon oxide ($SiO_2$), and thus may be merged with the second insulating interlayer 230 thereunder.

In an example embodiment of the present inventive concept, the first opening may be formed to extend on the first region I of the substrate 100 in the first direction, and a plurality of first openings may be formed and spaced apart from each other in the second direction.

After removing the second mask, the first and second sacrificial patterns 172 and 210 exposed by the first opening may be removed to form a gap between the third insulation patterns 220 at neighboring levels, between the first insulating interlayer 180 and the lowermost one of the third insulation pattern 220, and between the first insulating interlayer 180 and the first insulation pattern 162, and a portion of an outer sidewall of the first blocking pattern 260 and a portion of a sidewall of the epitaxial layer 250 may be exposed by the gap. In an example embodiment of the present inventive concept, the first and second sacrificial patterns 172 and 210 exposed by the first opening may be removed by a wet etching process using an etchant including phosphoric acid ($H_3PO_4$) or sulfuric acid ($H_2SO_4$). For example, when the first and second sacrificial patterns 172 and 210 are formed of silicon nitride ($Si_3N_4$) and the third insulation patterns 220 are formed of silicon oxide ($SiO_2$), the first and second sacrificial patterns 172 and 210 may be removed by an etching process using an etching solution including phosphoric acid ($H_3PO_4$).

A second blocking layer 340 may be formed on the exposed outer sidewall of the first blocking pattern 260, the exposed sidewall of the epitaxial layer 250, an inner wall of the gap, surfaces of the first and third insulation patterns 162 and 220, the exposed upper surface of the substrate 100 and an upper surface of the third insulating interlayer 330, a gate barrier layer may be formed on the second blocking layer 340, and a gate conductive layer may be formed on the gate barrier layer to sufficiently fill a remaining portion of the gap. The second blocking layer 340 may be formed by a deposition method having an excellent step coverage property. For example, the second blocking layer 340 may be formed by a CVD process or an ALD process.

The gate conductive layer and the gate barrier layer may be partially removed to form a gate conductive pattern 360 and a gate barrier pattern 350, respectively, in the gap, and the gate conductive pattern 360 and the gate barrier pattern 350 altogether may form a first gate electrode 370. In an example embodiment of the present inventive concept, the gate conductive layer and the gate barrier layer may be partially removed by a wet etching process. The second blocking layer 340 may include a metal oxide, e.g., aluminum oxide ($Al_2O_3$), hafnium oxide ($HfO_2$), etc., the gate conductive pattern 360 may include a low electrical resistance metal, e.g., tungsten (W), titanium (Ti), tantalum (Ta), platinum (Pt), etc., and the gate barrier pattern 350 may include a metal nitride, e.g., titanium nitride (TiN), tantalum nitride (TaN), etc.

In an example embodiment of the present inventive concept, the first gate electrode 370 may extend in the first direction, and a plurality of first gate electrodes 370 may be formed in the second direction. That is, the plurality of first gate electrodes 370 each of which may extend in the first direction may be spaced apart from each other in the second direction by the first opening.

The first gate electrodes 370 may be formed at a plurality of levels, respectively, in the third direction to be spaced apart from each other, and may together form a gate electrode structure. A portion of each of the first gate electrodes 370 not covered by upper ones of the first gate electrodes 370 but exposed is referred to as a pad. In an example embodiment of the present inventive concept, at least one pad of the first gate electrodes 370 may have an upper surface higher than those of other portions thereof so as to have a relatively greater thickness. FIG. 6 illustrates that the pads of all the first gate electrodes 370 except for a lowermost one and an uppermost one have a relatively greater thickness, however, the present inventive concept may not be limited thereto. For example, the pads of all the first gate electrodes 370 except for a lowermost one and an uppermost one may have a thickness greater than those of other portions thereof, so that each of second contact plug structures 554 to be described (see FIG. 14) may be easily formed to contact the upper portion of the corresponding one of the pads at the gate conductive pattern 360.

The gate electrode structure may include a ground selection line (GSL) 410, a word line 420 and a string selection line (SSL) 430 sequentially stacked in the third direction. The GSL 410 may be formed at a lowermost level, each of the word line 420 and the SSL 430 may be formed on the GSL 410 at one level or a plurality of levels. In an example embodiment of the present inventive concept, the SSL 430 may be formed at an uppermost level and one level directly under the uppermost level, and the word line 420 may be formed between the GSL 410 and the SSL 430 at a plurality of levels. However, the present inventive concept may not be limited thereto.

Impurities may be implanted into the upper portion of the substrate 100 exposed by the first opening to form a second impurity region. The impurities may include n-type impurities, e.g., phosphorus (P), arsenic (As), etc. Alternatively, the impurities may include p-type impurities, e.g., boron (B), aluminum (Al), gallium (Ga), etc.

After forming a second spacer layer on the upper surface of the substrate 100 exposed by the first opening, a sidewall of the first opening and the upper surface of the third insulating interlayer 330, the second spacer layer may be anisotropically etched to form a second spacer on the sidewall of the first opening. Accordingly, a portion of the second impurity region at the upper portion of the substrate 100 may be exposed. The second spacer layer may include an insulating material, e.g., an oxide or a nitride.

A common source line (CSL) may be formed on the exposed second impurity region to fill a remaining portion of the first opening. In an example embodiment of the present inventive concept, after forming a conductive layer on an upper surface of the exposed second impurity region, the second spacer and the third insulating interlayer 330, an upper portion of the conductive layer may be planarized until the upper surface of the third insulating interlayer 330 is exposed to form the CSL. During the planarization process, a portion of the second blocking layer 340 on the upper surface of the third insulating interlayer 330 may also be removed together with the third insulating interlayer 330. The CSL may be formed in the first opening to contact an upper surface of the second impurity region thereunder, and may include a conductive material, e.g., a metal, a metal nitride, etc. For example, the metal included in the CSL may be a low resistance metal, e.g., tungsten (W), titanium (Ti), tantalum (Ta), platinum (Pt), etc. The CSL may be electrically insulated from the plurality of first gate electrodes 370 because the sidewall of the CSL is covered by the second spacer, and the plurality of first gate electrodes 370 may extend in the first direction and may be spaced apart from each other in the second direction by the CSL and the second spacer.

Figure 7:
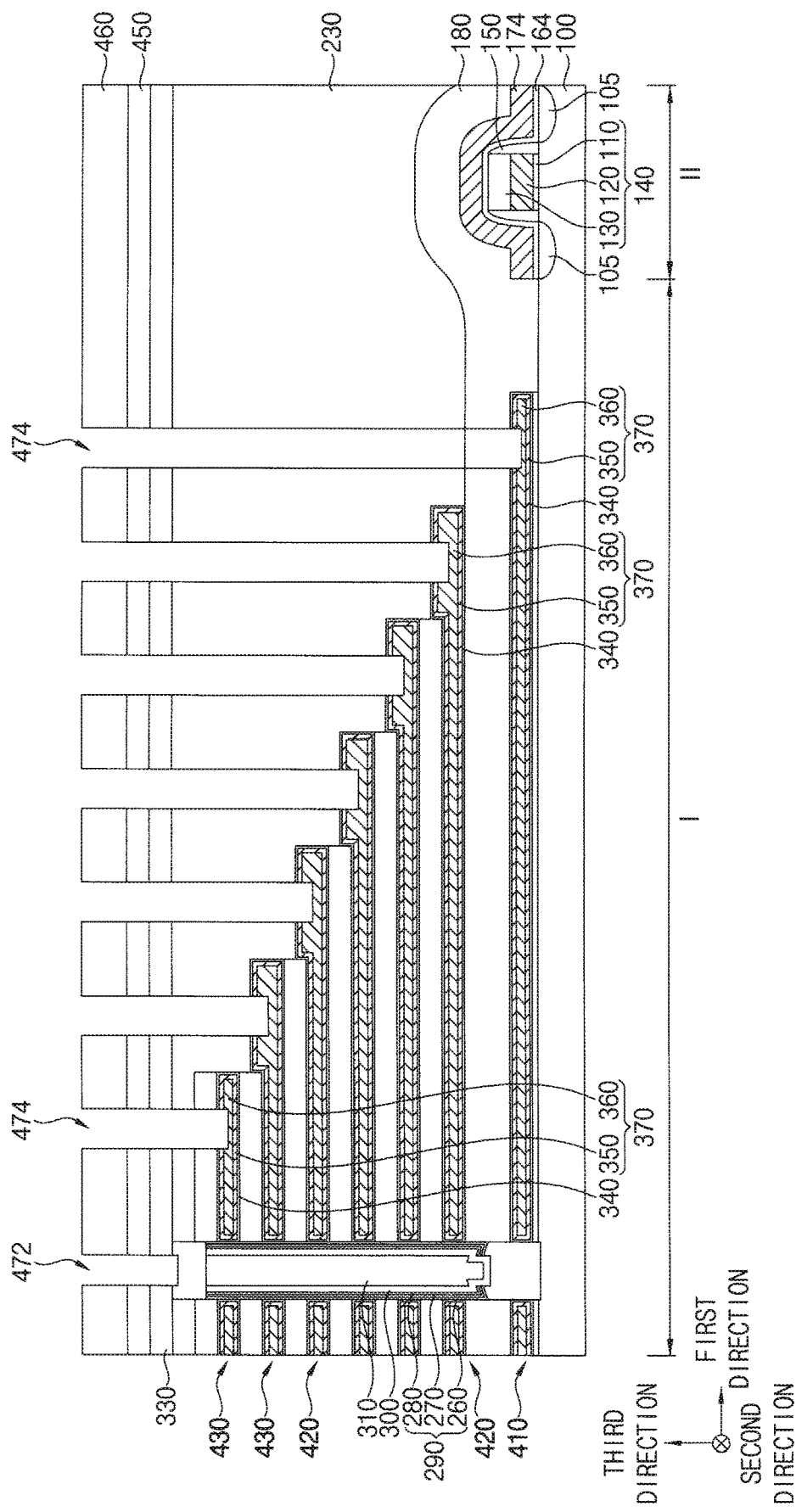

Referring to FIG. 7, after forming a fourth insulating interlayer 450 on the third insulating interlayer 330, the CSL, the second spacer and the second blocking layer 340, a third mask 460 may be formed on the fourth insulating interlayer 450, and the first to fourth insulating interlayers 180, 230, 330 and 450 may be etched using the third mask 460 as an etching mask to form first and second contact holes 472 and 474.

The third mask 460 may include, e.g., an ACL, an SOH, a photoresist pattern, etc. The formation of the third mask 460 may include a photolithography process, and may additionally include an anisotropic etching process.

The first contact hole 472 may extend through the third and fourth insulating interlayers 330 and 450 to expose an upper surface of the capping pattern 320, ones of the second contact holes 474 may extend through the second to fourth insulating interlayers 230, 330 and 450 to expose upper surfaces of the pads of the word line 420 and the SSL 430 of the first gate electrodes 370, and another one of the second contact holes 474 may extend through the first to fourth insulating interlayers 180, 230, 330 and 450 to expose an upper surface of the pad of the GSL 410 of the first gate electrodes 370.

In an example embodiment of the present inventive concept, each of the second contact holes 474 may expose an upper surface of the gate conductive pattern 360 in the first gate electrode 370, and when the second contact holes 474 are formed, a portion under the upper surface of the exposed gate conductive pattern 360 may also be removed. Since the pads of all the first gate electrodes 370 except for a lowermost one and an uppermost one may have a thickness greater than those of other portions thereof, each of the second contact holes 474 may be easily formed to expose the corresponding one of the gate conductive patterns 360 and may not penetrate through the corresponding one of the gate conductive patterns 360.

Figure 8:
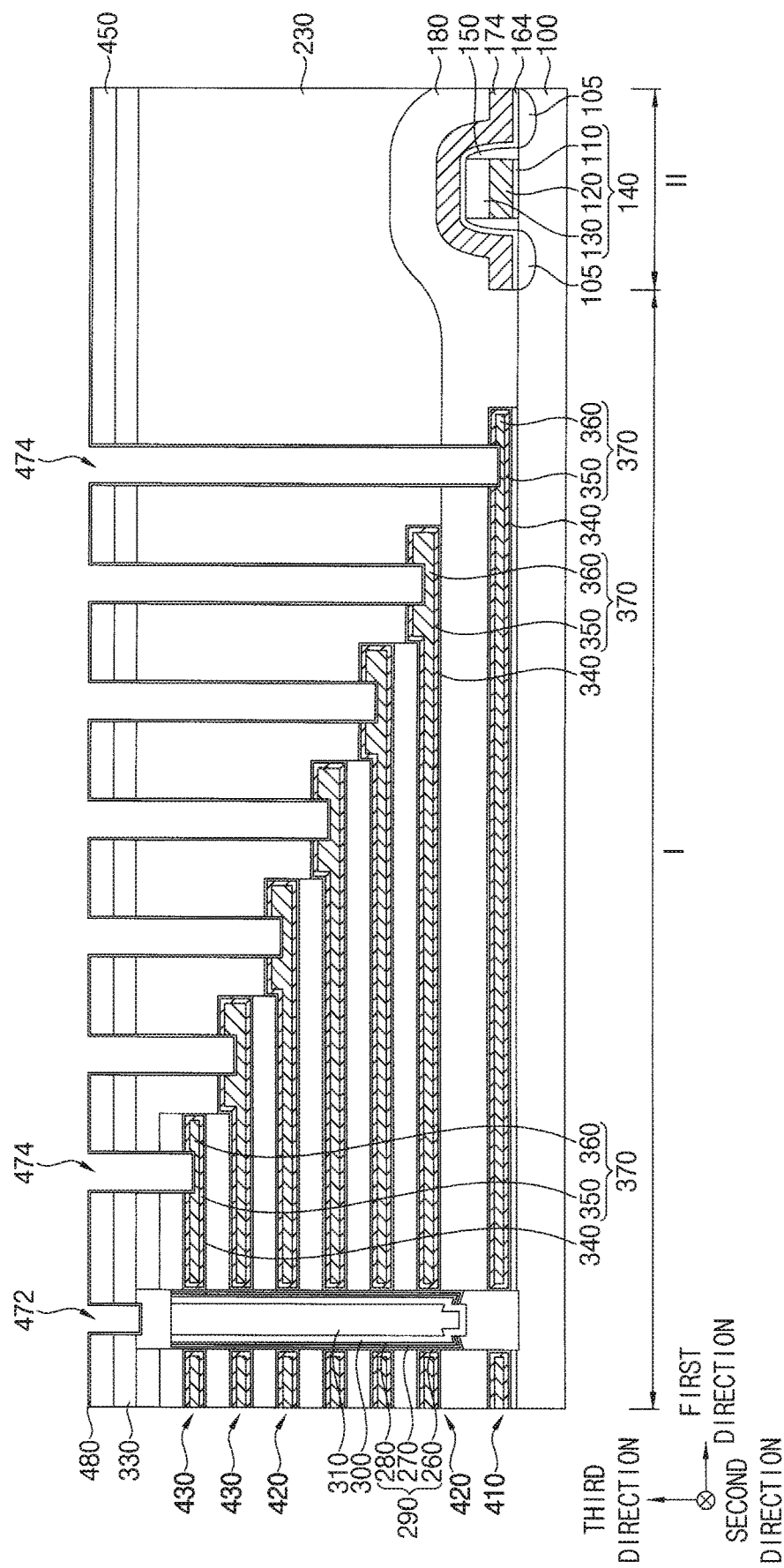

Referring to FIG. 8, after removing the third mask 460, an oxidation prevention layer 480 may be formed on sidewalls of the first and second contact holes 472 and 474, the upper surfaces of the capping pattern 320 and the gate conductive patterns 360 exposed by the first and second contact holes 472 and 474.

In an example embodiment of the present inventive concept, the third mask 460 may be removed by an ashing process using an oxygen plasma, and a metal oxide layer may be formed on the upper surfaces of the gate conductive patterns 360 exposed by the second contact holes 474.

A first cleaning process may be performed to remove the metal oxide layer. In an example embodiment of the present inventive concept, the first cleaning process may include a wet etching process. For example, a residue (i.e., the metal oxide layer) remaining on the portions of the first gate electrodes 370 exposed by the second contact holes 474 may be removed by the wet etching process. When the first cleaning process is performed, portions of the gate conductive patterns 360 exposed by the second contact holes 474 may be partially removed.

The oxidation prevention layer 480 may be formed after the first cleaning process. The oxidation prevention layer 480 may include, e.g., a semiconductor material such as polysilicon.

Figure 9:
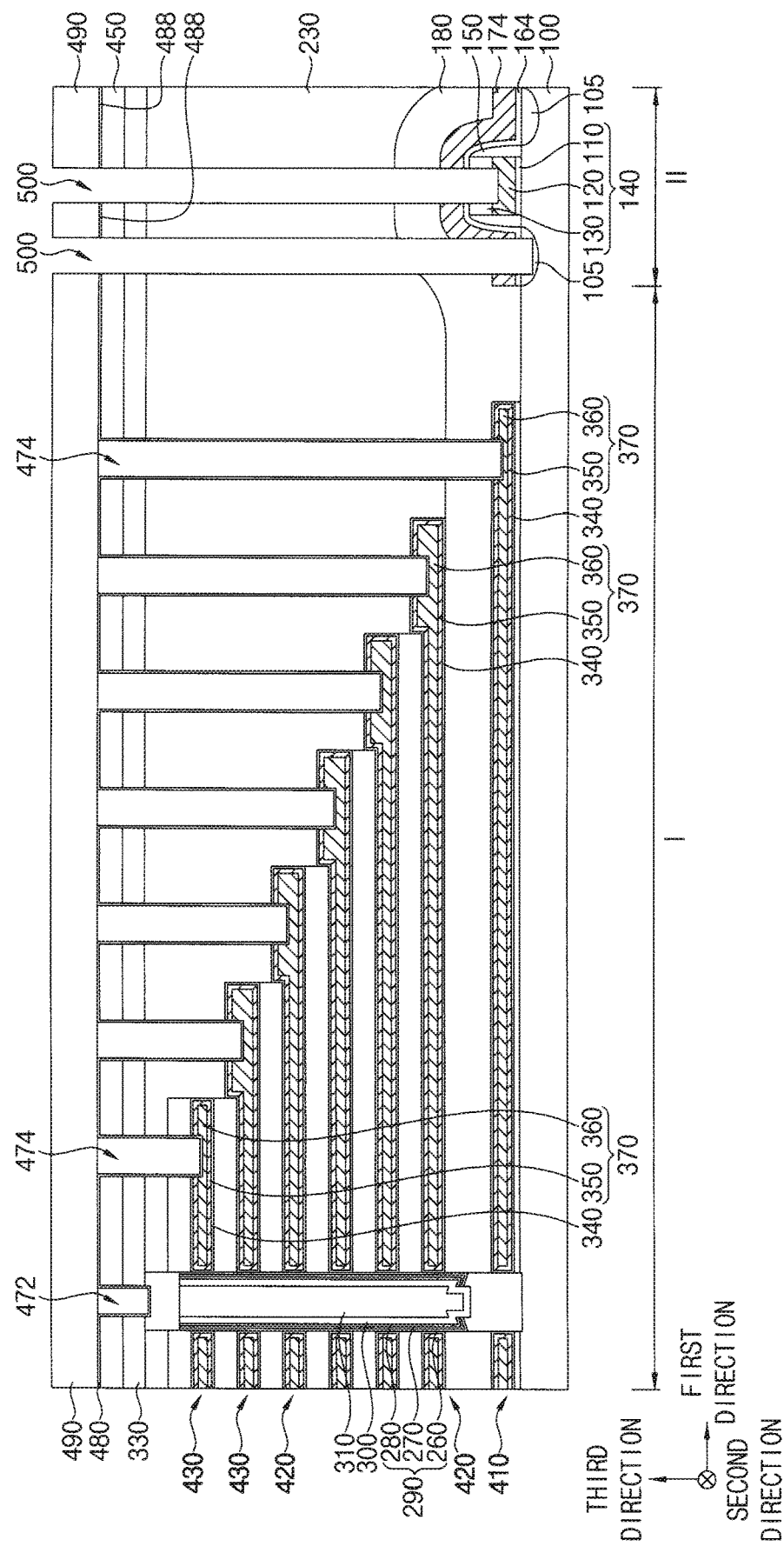

Referring to FIG. 9, after forming a fourth mask 490 on the oxidation prevention layer 480 to cover the first region I of the substrate 100 and expose a portion of the second region II of the substrate 100, the oxidation prevention layer 480, the first to fourth insulating interlayers 180, 230, 330 and 450, the etch stop pattern 174 and the second insulation pattern 164 may be etched using the fourth mask 490 as an etching mask to form a third contact hole 500.

The fourth mask 490 may include a material the same as that of the third mask 460. The fourth mask 490 may have a low gap fill characteristic, and thus may not be formed in the first and second contact holes 472 and 474.

In an example embodiment of the present inventive concept, an ACL as the fourth mask 490 may be formed on the polysilicon layer (i.e., the oxidation prevention layer 480), and then the polysilicon layer, the first to fourth insulating interlayers 180, 230, 330 and 450, the etch stop pattern 174 and the second insulation pattern 164 may be etched using the ACL as an etching mask to form a third contact hole 500, followed by removing the ACL by an ashing process using oxygen plasma.

The third contact hole 500 may expose an upper surface of the second gate electrode 120 in the gate structure 140, or may expose an upper surface of the first impurity region 105 on the second region II of the substrate 100, and when the third contact hole 500 is formed, a portion under the upper surface of the exposed second gate electrode 120 or a portion under the upper surface of the exposed first impurity region 105 may also be removed.

A portion of the oxidation prevention layer 480 on the second region II of the substrate 100 may remain as a first oxidation prevention pattern 488 by the formation of the third contact hole 500.

Figure 10:
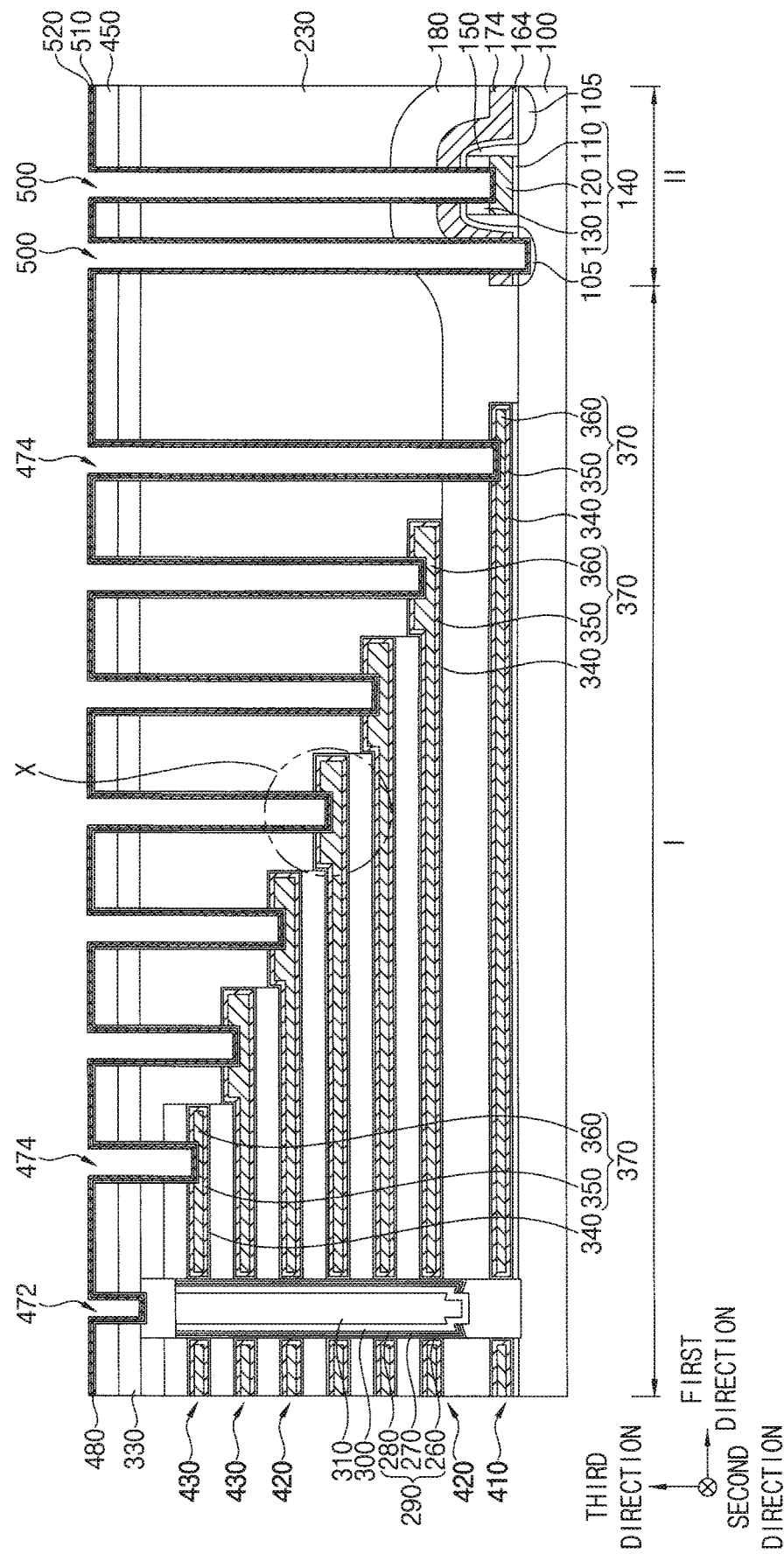
Figure 11:
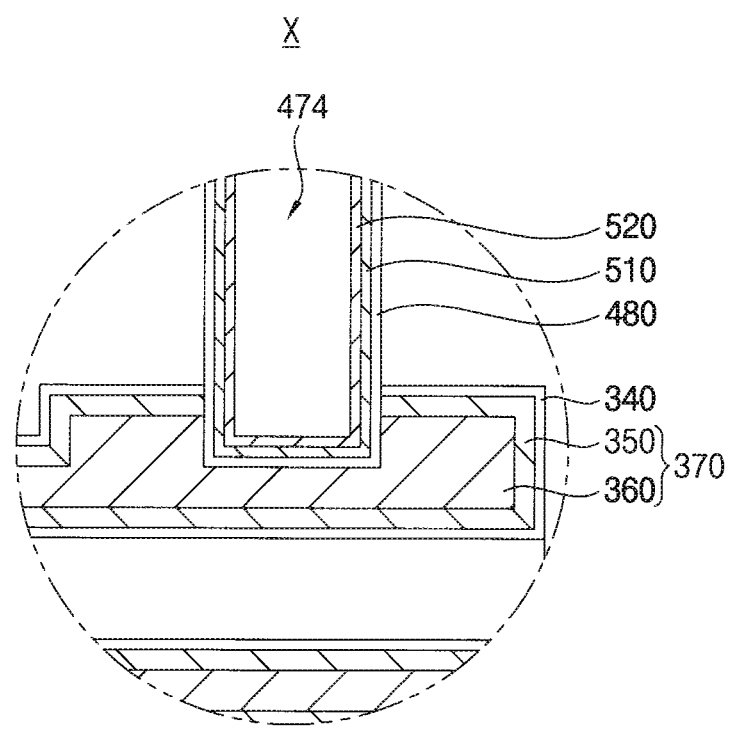

Referring to FIG. 10, after removing the fourth mask 490 to expose the oxidation prevention layer 480 and the first oxidation prevention pattern 488, a barrier layer may be formed on the exposed oxidation prevention layer 480 and the first oxidation prevention pattern 488, a sidewall of the third contact hole 500, the upper surfaces of the second gate electrodes 120, and the first impurity region 105 exposed by the third contact hole 500.

In an example embodiment of the present inventive concept, the fourth mask 490 may be removed by an ashing process using oxygen plasma, and during the removal process, the upper surfaces of the gate conductive patterns 360 exposed by the second contact holes 474 may be covered by the oxidation prevention layer 480, and thus the formation of a metal oxide layer may be prevented. Accordingly, no additional cleaning process for removing the metal oxide layer may be performed, so that the additional etching of the gate conductive patterns 360 may be suppressed. For example, without additional etching of the gate conductive patterns 360, the second contact holes 474 penetrating through the gate conductive patterns 360 may be prevented. Accordingly, a contact resistance between each of the second contact plug structures 554 to be described (see FIG. 14) formed in the second contact holes 474 and a corresponding one of the first gate electrodes 370 may be reduced, and electrical short between the first gate electrodes 370 formed on different levels may be prevented.

In an example embodiment of the present inventive concept, the barrier layer may include a first metal layer 510 and a metal nitride layer 520 sequentially stacked. The metal nitride layer 520 may be formed to increase the adhesion between first to third metal patterns 542, 544 and 546 (see FIG. 14) subsequently formed and the first metal layer 510. FIG. 11 is an enlarged cross-sectional view of a region X in FIG. 10.

The first metal layer 510 may include, e.g., titanium (Ti), tantalum (Ta), etc., and the metal nitride layer 520 may include, e.g., titanium nitride (TiN), tantalum nitride (TaN), etc.

Figure 12:
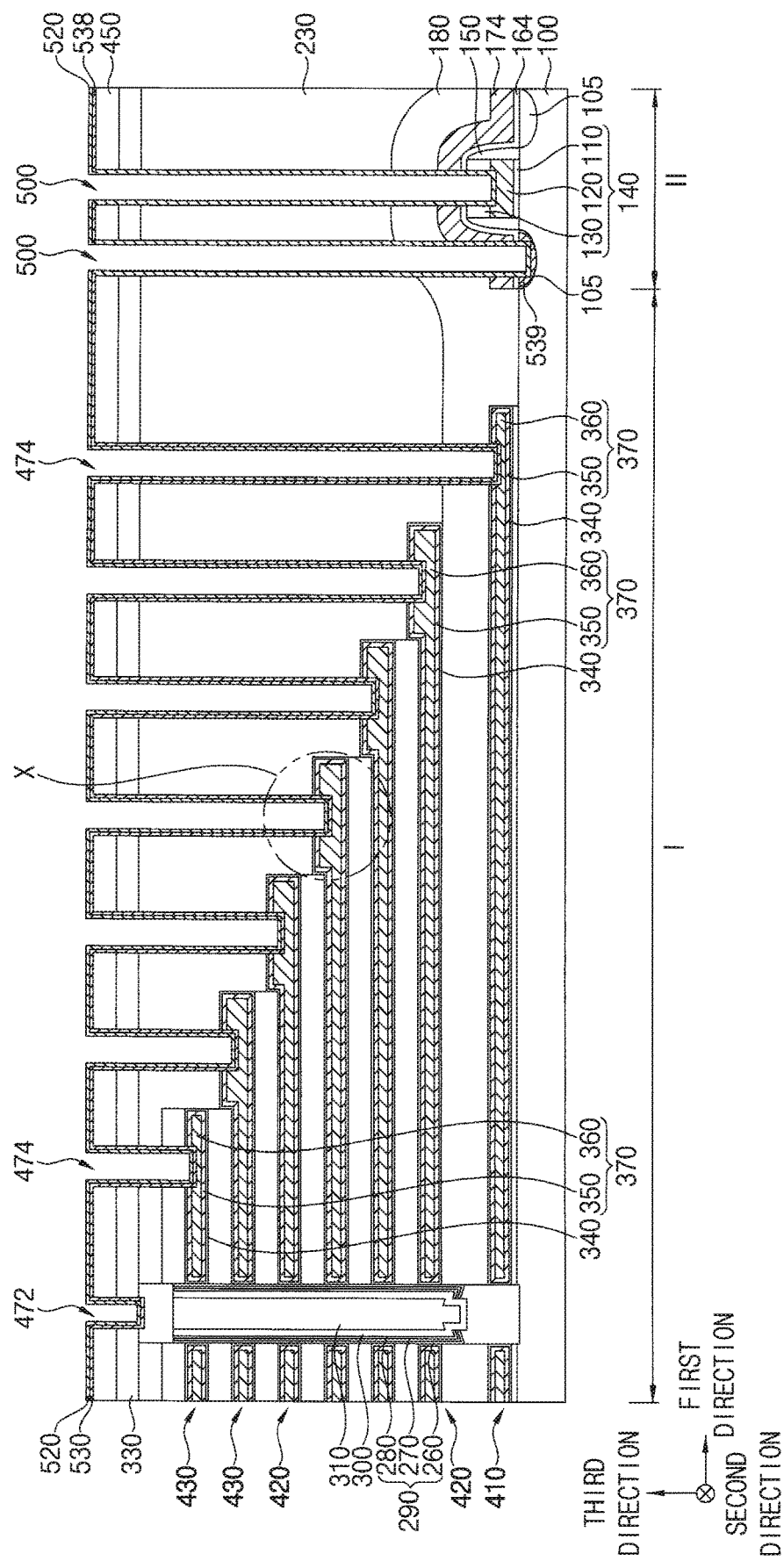
Figure 13:
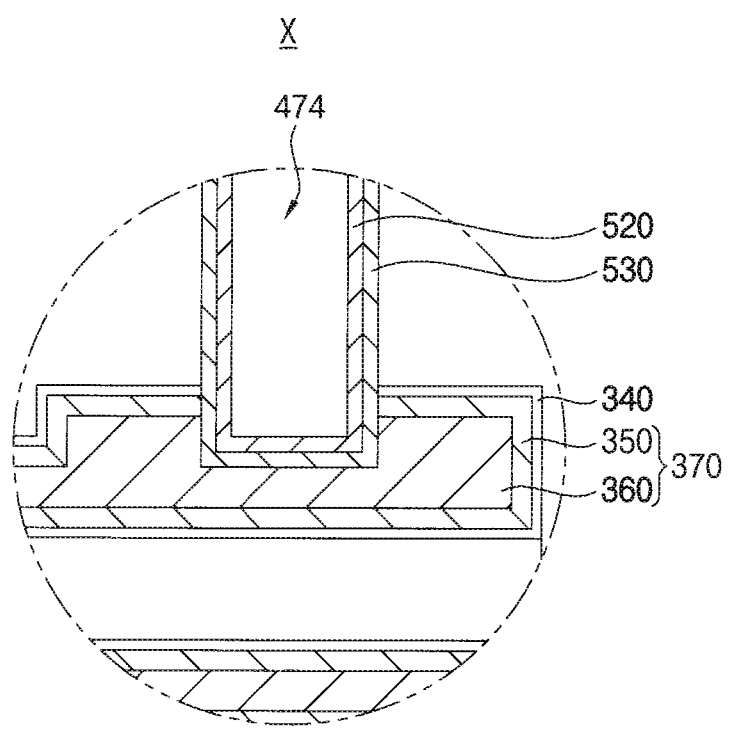

Referring to FIGS. 12 and 13, a heat treatment process may be performed on the barrier layer, and the barrier layer may react with the oxidation prevention layer 480 thereunder to form a metal silicide layer 530.

In an example embodiment of the present inventive concept, the metal silicide layer 530 may be formed by reaction between the first metal layer 510 of the barrier layer and the oxidation prevention layer 480 contacting the first metal layer 510 by the heat treatment process. On the second region II of the substrate 100, a third metal silicide pattern 538 may be formed by reaction between the remaining first oxidation prevention pattern 488 and the first metal layer 510. However, only a portion of the first metal layer 510 that is relatively close to the oxidation prevention layer 480 or the first oxidation prevention pattern 488 may be transformed into the metal silicide layer 530 or the third metal silicide pattern 538.

In an example embodiment of the present inventive concept, the heat treatment process may be performed under a nitrogen atmosphere so that a portion of the first metal layer 510, that is relatively far from the oxidation prevention layer 480 or the first oxidation prevention pattern 488, not to be transformed into the metal silicide layer 530 or the third metal silicide pattern 538, may be transformed into a metal nitride layer to be merged with the metal nitride layer 520 on the first metal layer 510. Accordingly, the metal silicide layer 530 or the third metal silicide pattern 538 may include, e.g., titanium silicide ($TiSi_2$), tantalum silicide ($TaSi_2$), etc., and the merged metal nitride layer 520 may include, e.g., titanium nitride (TiN), tantalum nitride (TaN), etc.

The first impurity region 105 on the second region II of the substrate 100 and the first metal layer 510 in the barrier layer may react with each other to form a fourth metal silicide pattern 539. The fourth metal silicide pattern 539 may be one that has been transformed from an entire portion or a portion of the first impurity region 105.

Figure 14:
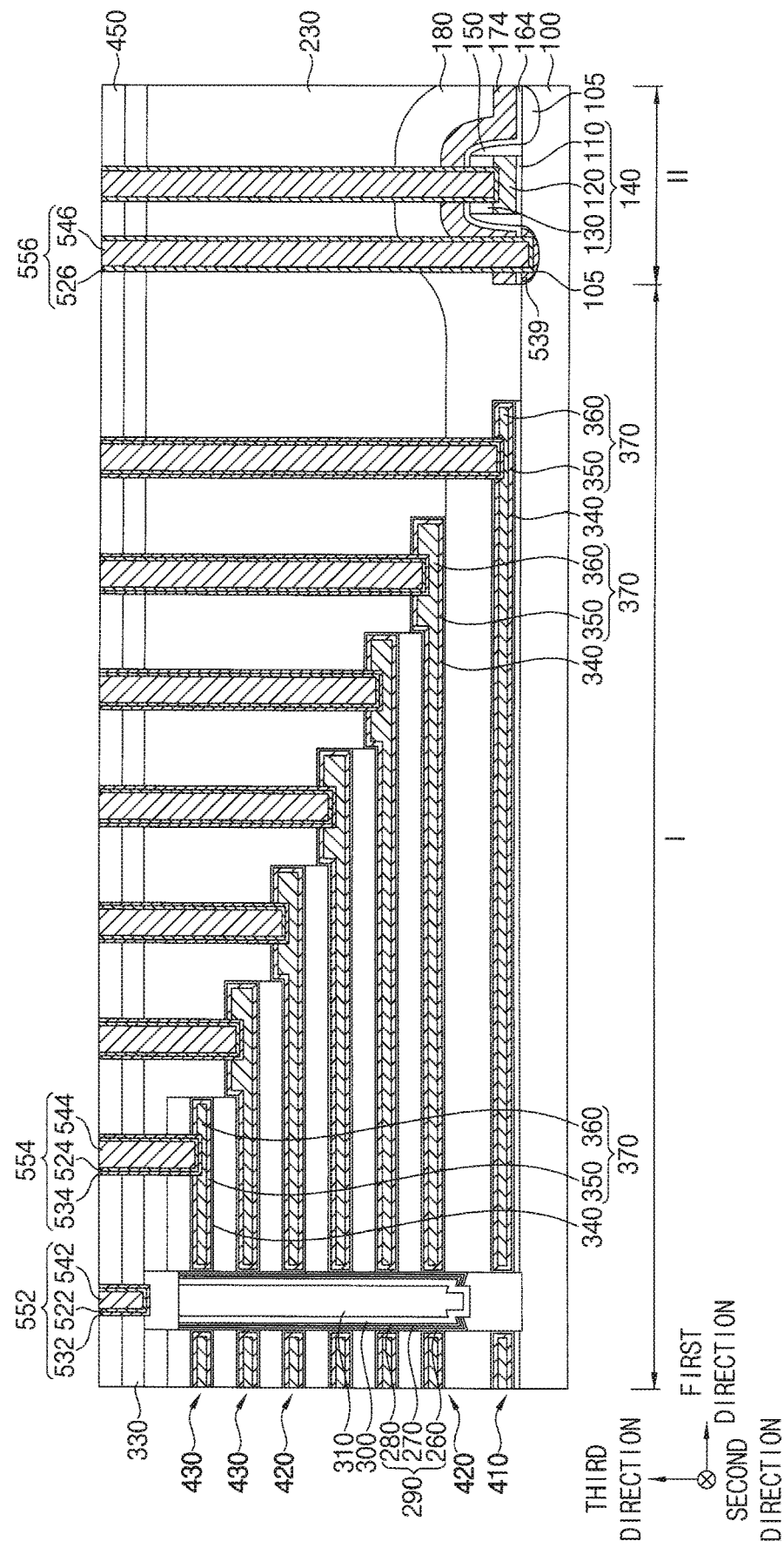

Referring to FIG. 14, after forming a second metal layer on the metal nitride layer 520 to fill remaining portions of the first to third contact holes 472, 474 and 500, the second metal layer, the metal nitride layer 520, the metal silicide layer 530 and the third metal silicide pattern 538 may be planarized until an upper surface of the fourth insulating interlayer 450 is exposed.

A first contact plug structure 552 including a first metal silicide pattern 532, a first metal nitride pattern 522 and a first metal pattern 542 sequentially stacked on the capping pattern 320 may be formed in the first contact hole 472, a second contact plug structure 554 including a second metal silicide pattern 534, a second metal nitride pattern 524 and a second metal pattern 544 sequentially stacked on the upper surface of the gate conductive pattern 360 of the first gate electrode 370 may be formed in the second contact hole 474. For example, the second metal nitride pattern 524 may cover lower and upper surfaces and a sidewall of the second metal pattern 544. A third contact plug structure 556 may be formed including a third metal nitride pattern 526 and a third metal pattern 546 sequentially stacked on an upper surface of the fourth metal silicide pattern 539 on the first impurity region 105 or the upper surface of the second gate electrode 120 of the gate structure 140 may be formed in the third contact hole 500. The first to third metal nitride patterns 522, 524 and 526 may be referred to as first to third barrier patterns, respectively. Thus, upper surfaces of the first, second and third contact plug structures 552, 554 and 556 are substantially coplanar with each other. Since the first to third metal patterns 542, 544 and 546 are all formed from the second metal layer, they may include substantially the same metal. Since the first to third barrier patterns (i.e., the first to third metal nitride patterns 522, 524 and 526) are all formed from the metal nitride layer 520, they may include substantially the same metal nitride.

Upper wirings connected with the first to third contact plug structure 552, 554 and 556 may be further formed to complete the fabrication of the vertical memory device.

As described above, after forming the second contact hole 474 to expose the first gate electrode 370, the oxidation prevention layer 480 may be formed on the upper surface of the exposed first gate electrode 370 and the sidewall of the second contact hole 474, so that in the ashing process for removing the fourth mask 490 used in the formation of the third contact hole 500, no metal oxide layer may be formed on the upper surface of the first gate electrode 370 by the oxygen plasma used in the ashing process.

The oxidation prevention layer 480 may include a semiconductor material. e.g., polysilicon, not an insulating material, and thus it is not necessary to perform a process of removing the oxidation prevention layer 480 for the electrical connection between the second contact plug structure 554 and the first gate electrode 370. Accordingly, in the process of removing the oxidation prevention layer 480, a portion of the first gate electrode 370 thereunder may also be removed together with the oxidation prevention layer 480, and by eliminating the process of removing the oxidation prevention layer 480, the second contact hole 474 may be prevented from penetrating through the first gate electrode 370. For example, to prevent oxide formation on the first gate electrode 370, conventionally, after forming the second contact hole 474, a silicon nitride layer is formed on an inner wall thereof. However, in order to connect the second contact plug structure 554 subsequently formed with the first gate electrode 370, the portion of the silicon nitride layer on the first gate electrode 370 must be removed by an anisotropically etched process. During the anisotropic etching process, not only the portion of the silicon nitride layer, but also a portion of the first gate electrode 370 thereunder may be removed, and a thickness of the first gate electrode 370 is usually thin, so that the first gate electrode 370 may be penetrated. In an example embodiment of the present inventive concept, instead of the insulating silicon nitride layer, a polysilicon layer may be formed on the first gate electrode 370, and the polysilicon layer may be subsequently transformed into a metal silicide layer 530 so that no additional etching process may be performed.

A portion of the oxidation prevention layer 480 on the exposed upper surface of the first gate electrode 370 may be transformed into the metal silicide layer 530 by the heat treatment process, so that the increase of resistance between the first gate electrode 370 and the second contact plug structure 554 may be suppressed.

The vertical memory device manufactured by the processes described above may include the first gate electrodes 370 spaced apart from each other in the vertical direction substantially perpendicular to the upper surface of the substrate 100 including the first and second regions I and II on the first region I of the substrate 100, the channel 300 extending through a plurality of first gate electrodes 370 and extending in the vertical direction, the second contact plug structure 554 contacting each of the first gate electrodes 370, extending in the vertical direction, and including the second metal pattern 544, the second barrier pattern 524 covering a lower surface and a sidewall of the second metal pattern 524 and the second metal silicide pattern 534 covering a lower surface and a sidewall of the second barrier pattern 524, and the third contact plug structure 556 extending in the vertical direction on the second region II of the substrate 100 and including the third metal pattern 546 and the third barrier pattern 526 covering a lower surface and a sidewall of the third metal pattern 546. Thus, a lower surface and a lower sidewall of the second metal silicide pattern 534 in the second contact plug structure 554 directly contact the corresponding one of the first gate electrodes 370. Also, a lower surface of the second contact plug structure 554 is higher than a lower surface of the gate conductive pattern 360 in the corresponding one of the first gate electrodes 370.

Figure 17:
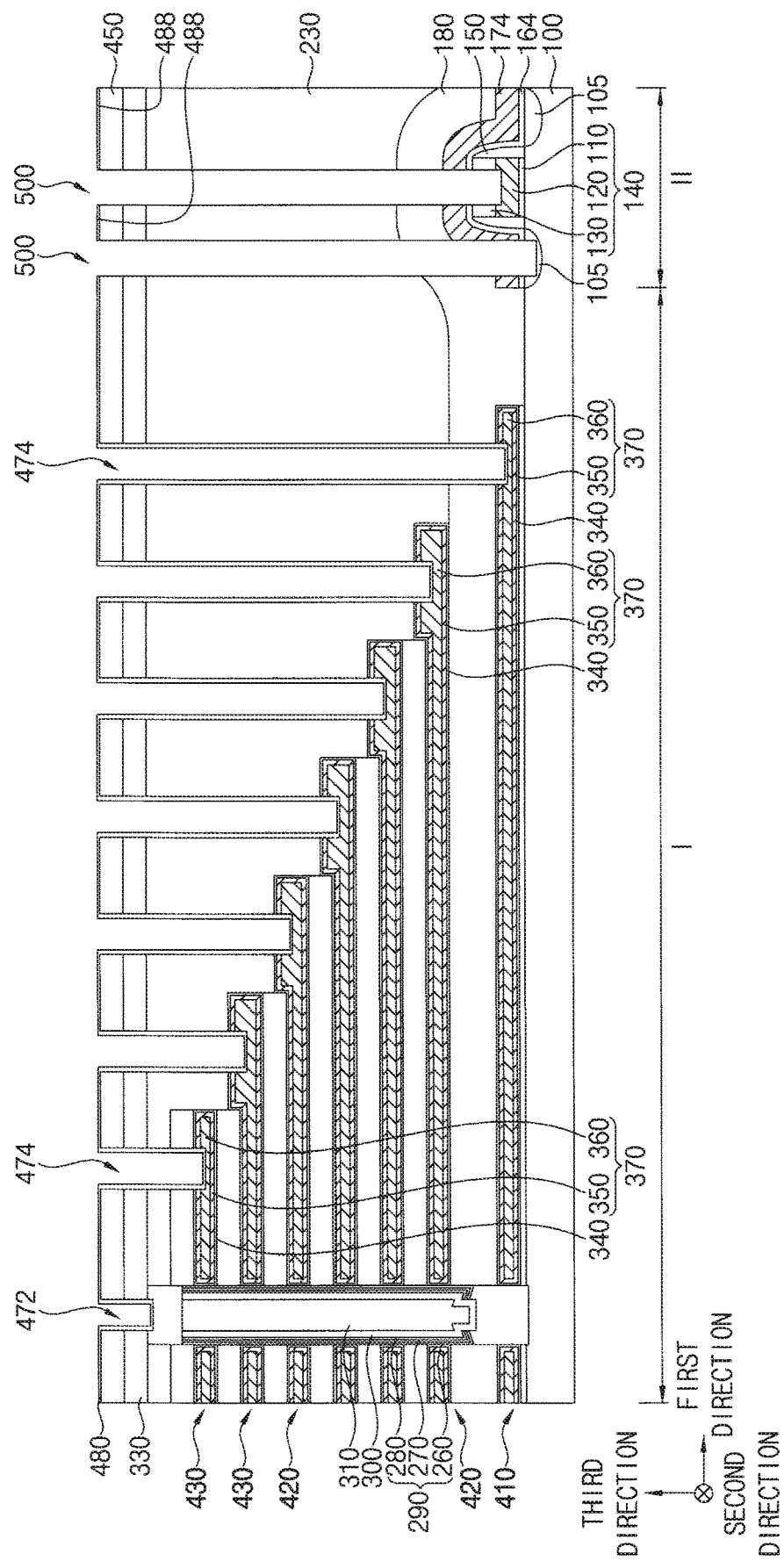
Figure 18:
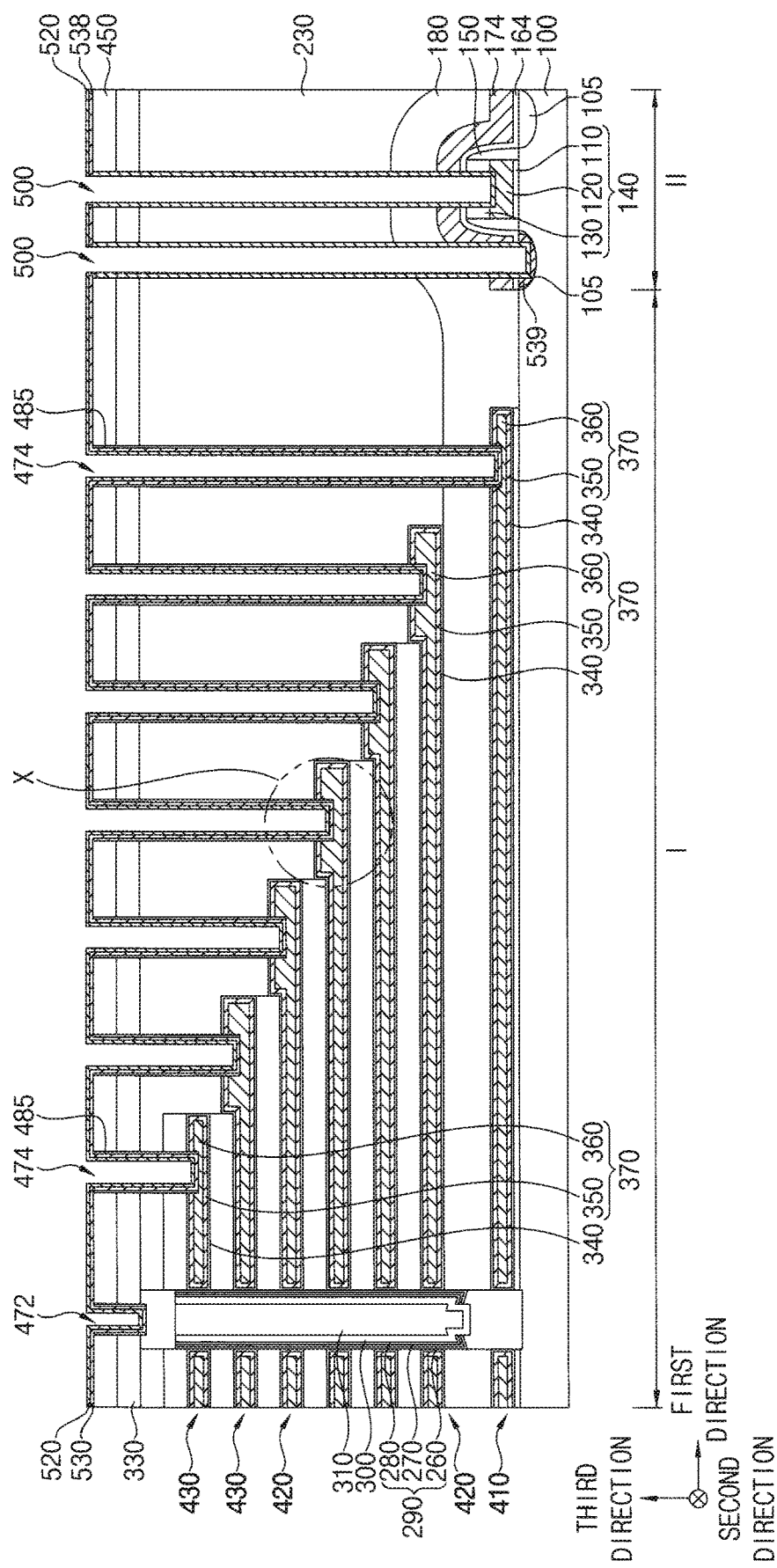
Figure 19:
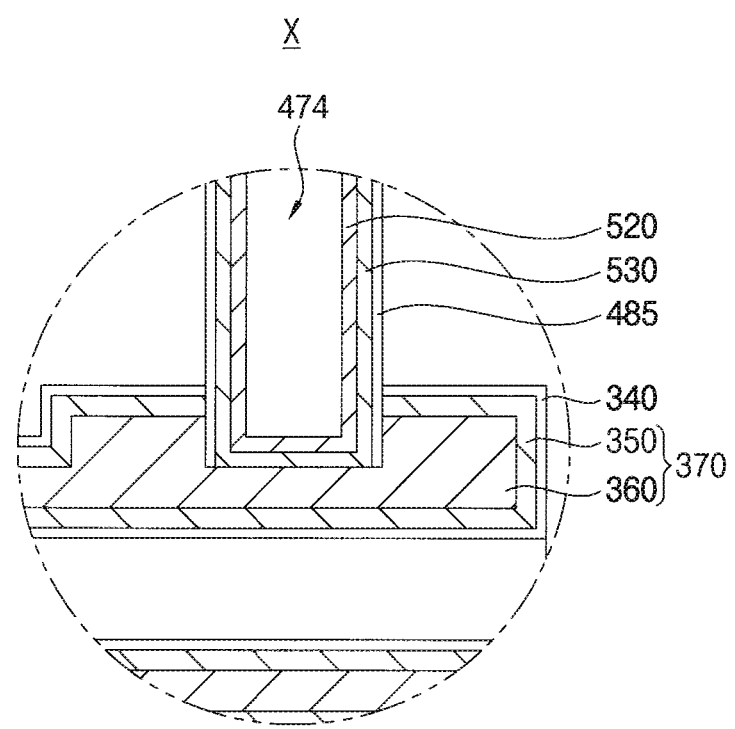

FIGS. 15 to 20 are cross-sectional views illustrating a method of manufacturing a vertical memory device in accordance with an example embodiment of the present inventive concept. FIG. 19 is an enlarged cross-sectional view of a region X in FIG. 18.

This method of manufacturing the vertical memory device illustrated in FIGS. 15 to 20 may include processes substantially the same as or similar to the processes described in FIGS. 1 to 14. Accordingly, like reference numerals refer to like elements, and detailed descriptions thereon are omitted herein.

Figure 15:
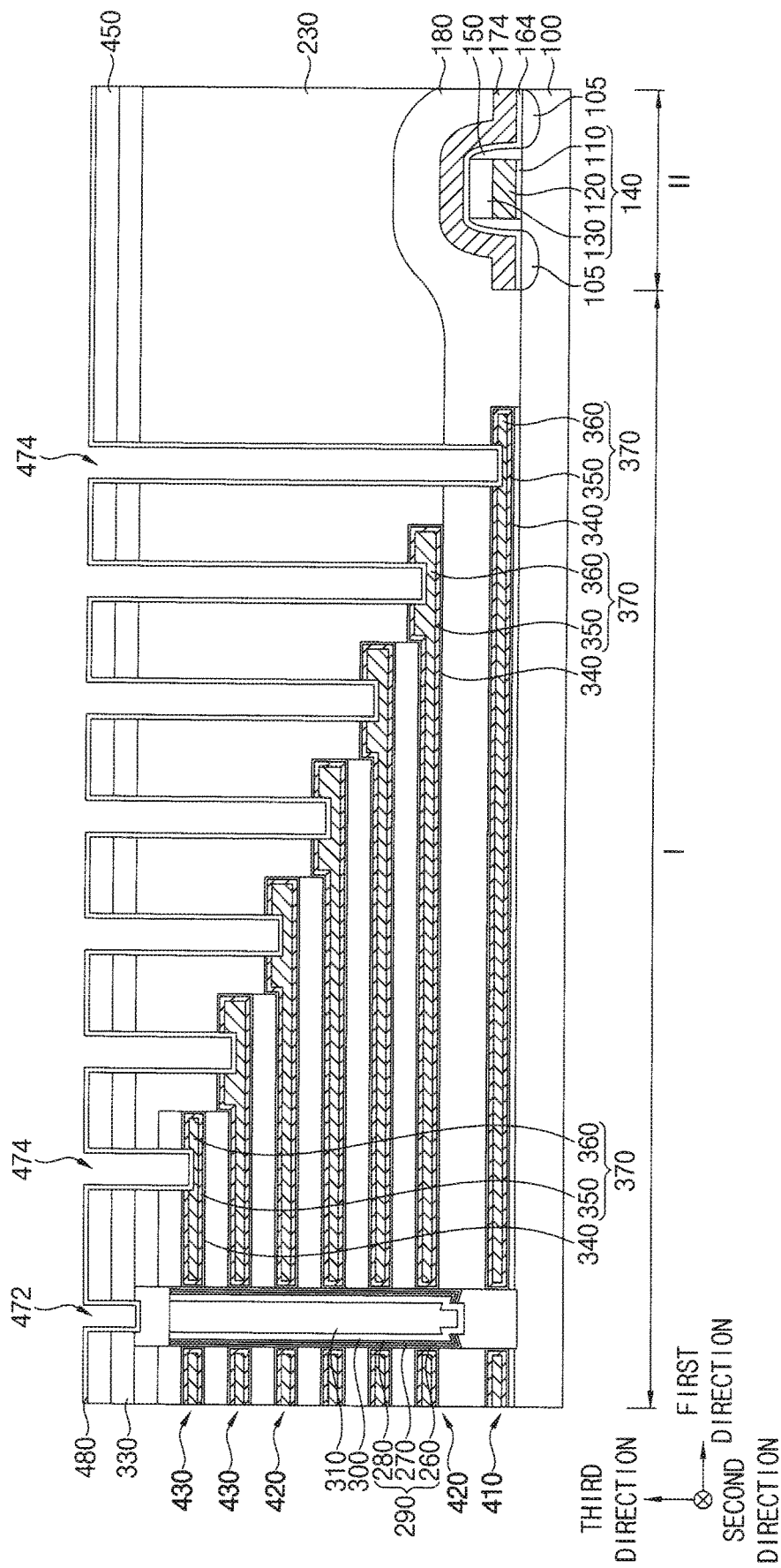
FIGS. 15 to 20 are cross-sectional views illustrating a method of manufacturing a vertical memory device in accordance with an example embodiment of the present inventive concept.

Referring to FIG. 15, processes substantially the same as or similar to the processes described in FIGS. 1 to 8 may be performed. However, the oxidation prevention layer 480 illustrated in FIG. 15 may be formed to have a thickness greater than that of the oxidation prevention layer 480 formed by the process described in FIG. 8.

Figure 16:
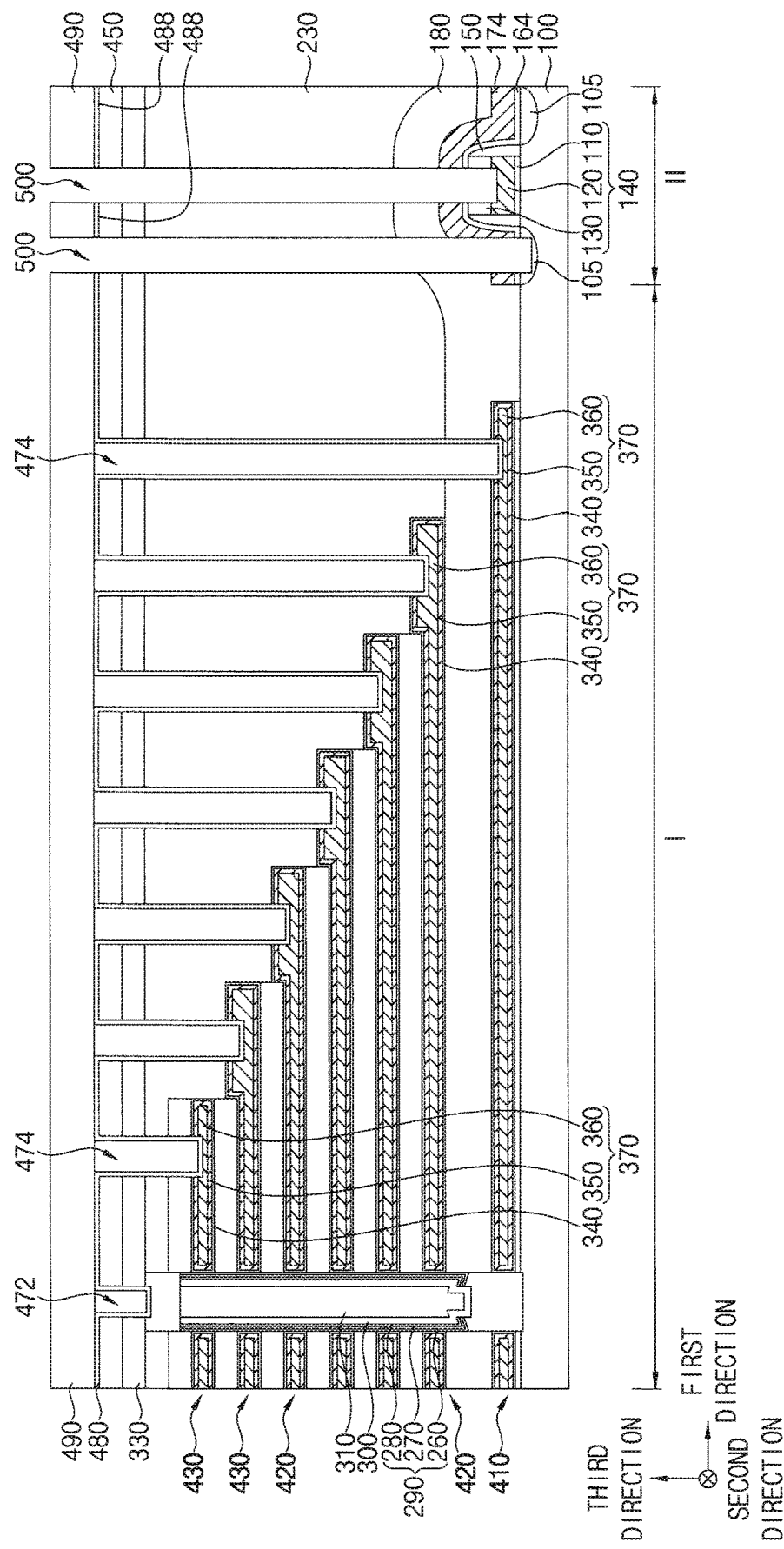

Referring to FIG. 16, processes substantially the same as or similar to the processes described in FIG. 9 may be performed.

Referring to FIG. 17, after removing the fourth mask 490, a second cleaning process may be performed to remove a residue remaining on the first impurity region 105.

The residue may remain on the first impurity region 105 by the ashing process for removing the fourth mask 490, and may be removed by the second cleaning process. In an example embodiment of the present inventive concept, the second cleaning process may include a dry etching process, and a portion of the oxidation prevention layer 480 may be removed together with the residue by the dry etching process. The dry etching process may include an anisotropic etching process. That is, a portion of the capping pattern 320 and a portion of the oxidation prevention layer 480 on the upper surface of the first gate electrode 370 exposed by the first and second contact holes 472 and 474, and a portion of the oxidation prevention layer 480 on the upper surface of the fourth insulating interlayer 450 may be partially removed, however, all of these portions may not be completely removed and at least a portion thereof may remain so that the upper surface of the first gate electrode 370 may still be covered by the oxidation prevention layer 480.

Referring to FIGS. 18 and 19, processes substantially the same as or similar to the processes described in FIGS. 10 and 11 may be performed. However, due to the portions of the oxidation prevention layer 480 on the capping pattern 320 and the upper surface of the first gate electrode 370 may have relatively smaller thickness than portions thereof on sidewalls of the first and second contact holes 472 and 474, all of the portions of the oxidation prevention layer 480 on the capping pattern 320 and the upper surface of the first gate electrode 370 may be transformed into the metal silicide layer 530 by the heat treatment process, while the portions of the oxidation prevention layer 480 on the sidewalls of the first and second contact holes 472 and 474 may not be completely transformed into the metal silicide layer 530 by the heat treatment process, and may have some parts remaining as a second oxidation prevention pattern 485.

Figure 20:
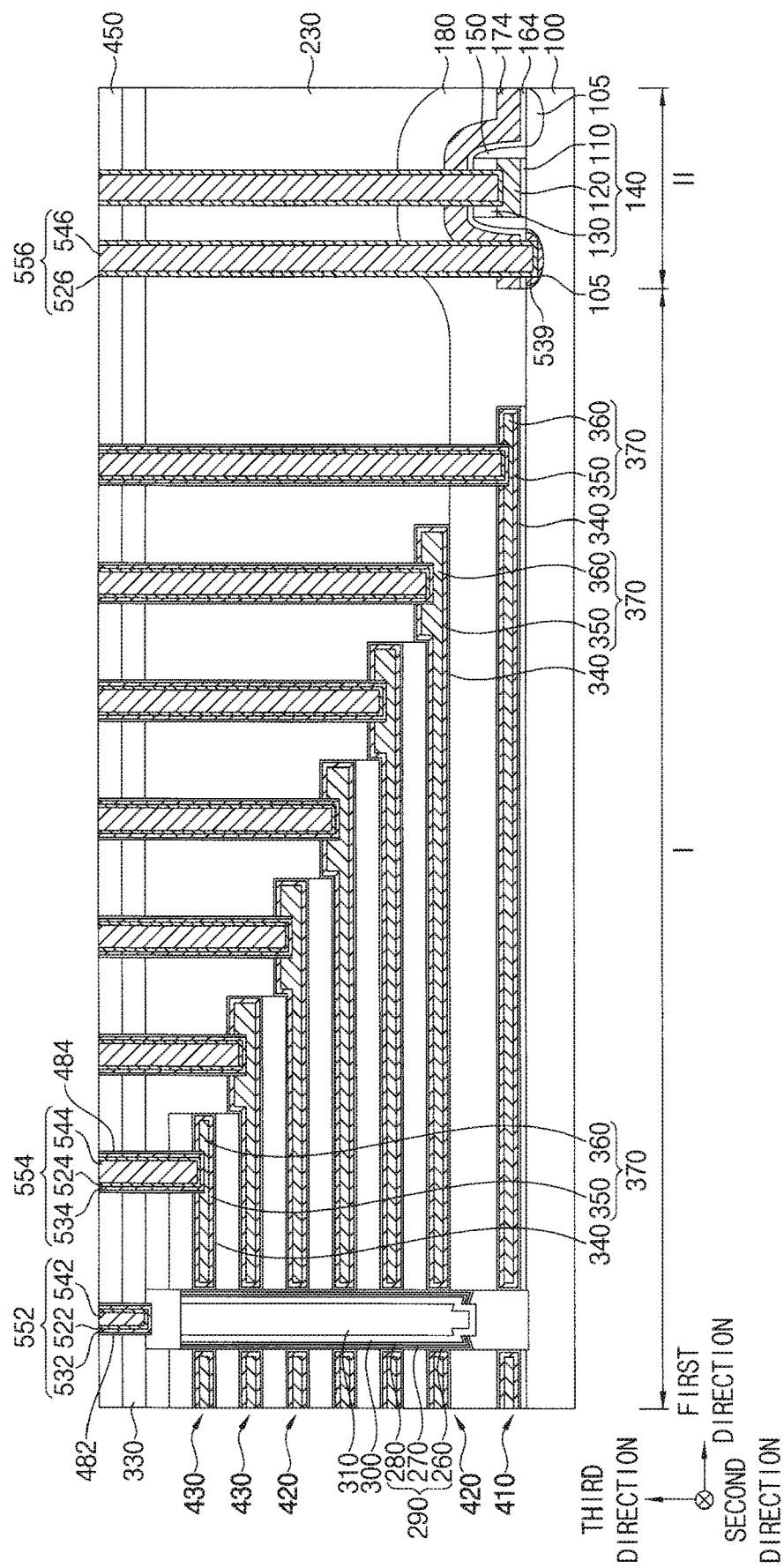

Referring to FIG. 20, processes substantially the same as or similar to the processes described in FIGS. 12 to 14 may be performed to complete the fabrication of the vertical memory device.

In this method of manufacturing the vertical memory device as illustrated in FIGS. 15-20, the residue remaining on the first impurity region 105 may be removed by the second cleaning process, and the increase of contact resistance between the first gate electrode 370 and the second contact plug structure 554 may be prevented. For example, since the second oxidation prevention pattern 485 may be formed of polysilicon, a polysilicon pattern may cover each of the sidewalls of the first and second contact plug structures 552 and 554. Thus, a lower surface of the second metal silicide pattern 534 in the second contact plug structure 554 may directly contact the corresponding one of the first gate electrodes 370, and the polysilicon pattern covering the sidewall of the second contact plug structure 554 may directly contact the corresponding one of the first gate electrodes 370. Accordingly, a low contact resistance may be maintained between the first gate electrode 370 and the second contact plug structure 554.

Figure 21:
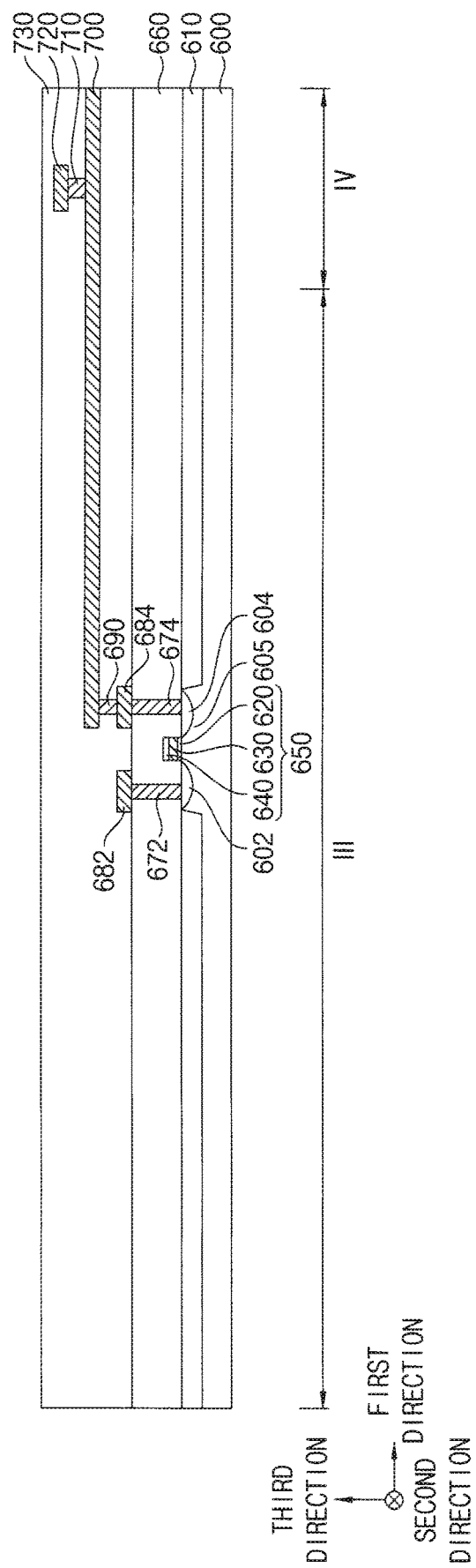
FIGS. 21 to 23 are cross-sectional views illustrating a method of manufacturing a vertical memory device in accordance with an example embodiment of the present inventive concept.
Figure 22:
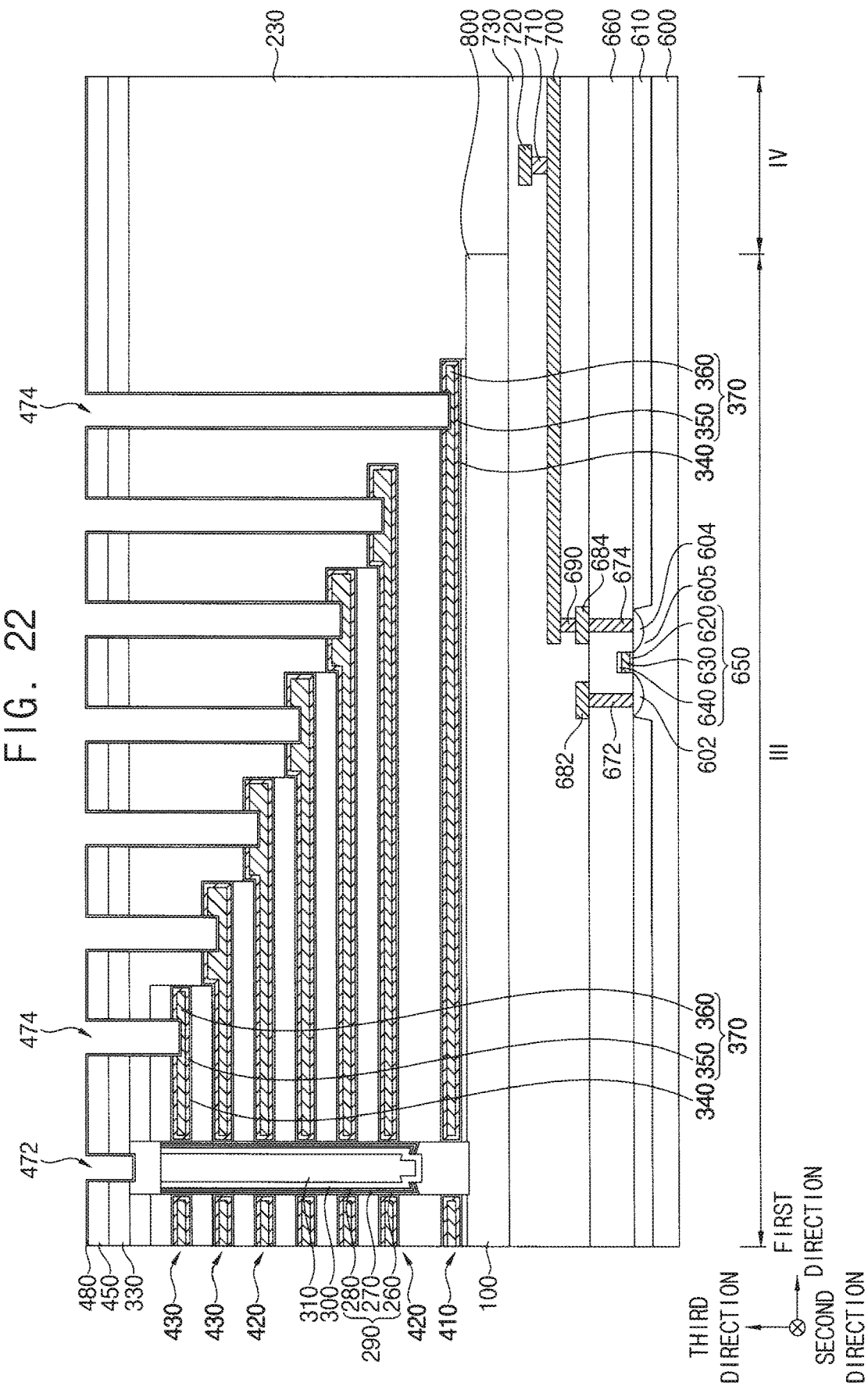
Figure 23:
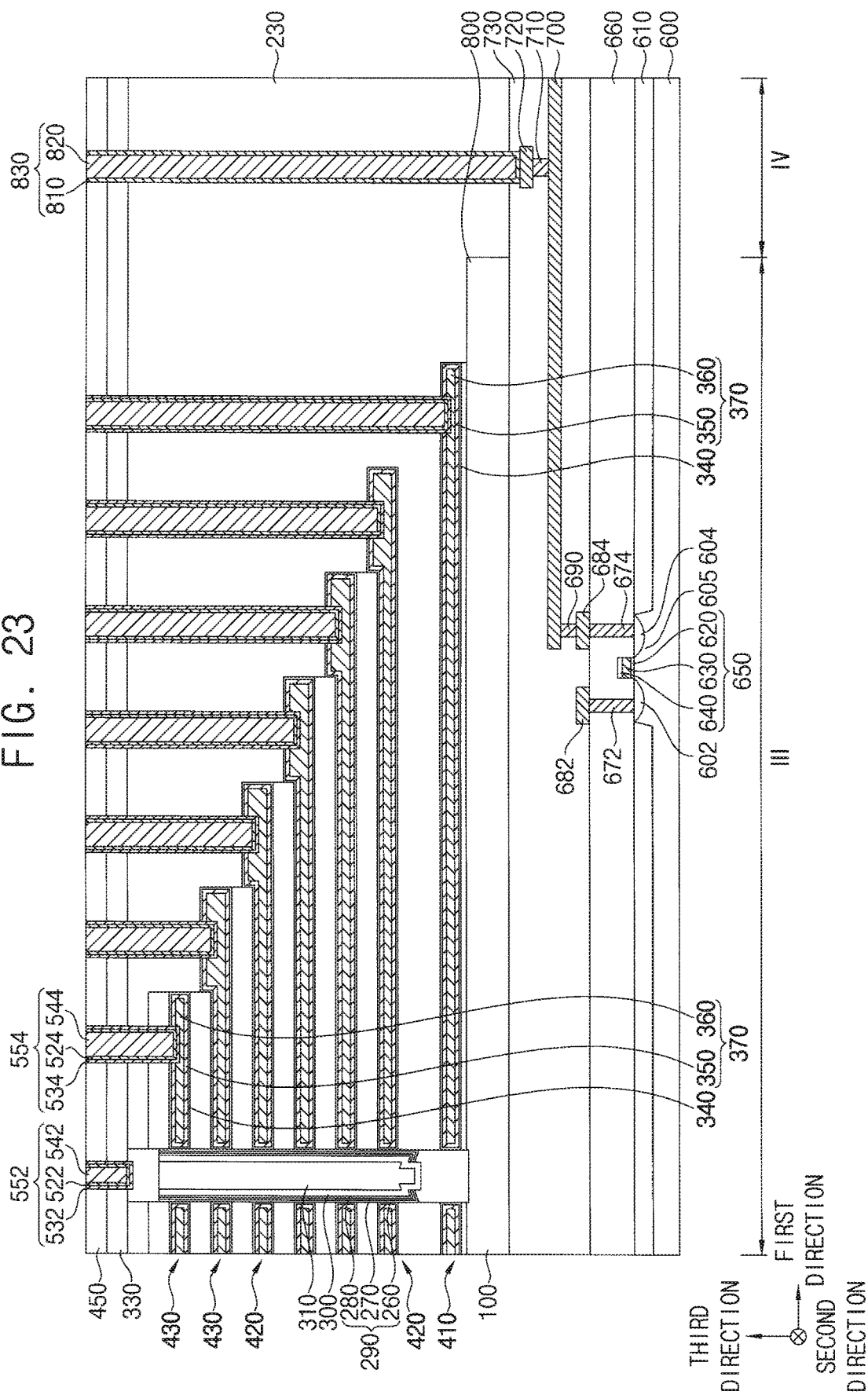

FIGS. 21 to 23 are cross-sectional views illustrating a method of manufacturing a vertical memory device in accordance with an example embodiment of the present inventive concept.

This method of manufacturing the vertical memory device illustrated in FIGS. 21 to 23 may include processes substantially the same as or similar to the processes described in FIGS. 1 to 14. Accordingly, like reference numerals refer to like elements, and detailed descriptions thereon are omitted herein.

Referring to FIG. 21, a circuit pattern may be formed on a substrate 600 including third and fourth regions III and IV, and first and second lower insulating interlayers 660 and 730 may be sequentially formed on the substrate 600 to cover the circuit pattern.

This vertical memory device may have a cell-over-peri (COP) structure. That is, a circuit pattern region in which the circuit pattern may be formed and a cell region may be stacked in the third direction on the substrate 600. For example, a cell array may be formed in the cell region over the circuit pattern (peripheral circuit) in the third direction. The cell region may be formed on the third region III of the substrate 600, and the fourth region IV of the substrate 600 may be referred to as a peripheral region. The substrate 600 may be divided into a field region on which an isolation pattern 610 may be formed, and an active region 605 on which no isolation pattern 610 may be formed.

The circuit pattern may include a transistor, a lower contact plug, a lower wiring, a lower via, etc. In an example embodiment of the present inventive concept, a transistor including a lower gate structure 650 and third and fourth impurity regions 602 and 604 at upper portions of the active region 605 adjacent to the lower gate structure 650 may be formed on the substrate 600. The lower gate structure 650 may include a lower gate insulation pattern 620, a lower gate electrode 630 and a lower gate mask 640 sequentially stacked on the substrate 600.

A first lower insulating interlayer 660 may be formed on the substrate 600 to cover the transistor, and first and second lower contact plugs 672 and 674 may extend in the third direction through the first lower insulating interlayer 660 to contact the third and fourth impurity regions 602 and 604, respectively.

First and second lower wirings 682 and 684 may be formed on the first lower insulating interlayer 660 to contact upper surfaces of the first and second lower contact plugs 672 and 674, respectively. A first lower via 690, a third lower wiring 700, a second lower via 710 and a fourth lower wiring 720 may be sequentially stacked on the second lower wiring 684. The fourth lower wiring 720 and the second lower via 710 may be formed on the fourth region IV of the substrate 600, and may be electrically connected to the fourth impurity region 604 formed in the third region III of the substrate 600.

A second lower insulating interlayer 730 may be formed on the first lower insulating interlayer 660 to cover the first to fourth lower wirings 682, 684, 700 and 720 and the first and second lower vias 690 and 710, and may be merged with the first lower insulating interlayer 660 thereunder. For example, the first and second lower insulating interlayers 660 and 730 may be formed of the same material.

Referring to FIG. 22, a base pattern 800 may be formed on the second insulating interlayer 730.

The base pattern 800 may be formed by forming a base layer on the second lower insulating interlayer 730 and patterning the base layer so that the base pattern 800 may only remain on the third region III of the substrate 600. The base pattern 800 may include, e.g., polysilicon.

Thereafter, processes substantially same as or similar to the processes described in FIGS. 1 to 8 may be performed. However, the gate structure 140, the gate spacer 150, the first impurity region 105, the second insulation pattern 164 and the etch stop pattern 174 on the second region II of the substrate 600 may not be formed. As described above, the transistor included in the circuit pattern may be formed on the third region III of the substrate 600 not on the fourth region IV of the substrate 600.

Referring to FIG. 23, processes substantially the same as or similar to the processes described in FIGS. 9 to 14 may be performed. However, a fourth contact plug structure 830 may be formed on the fourth region IV of the substrate 600, correspondingly to the third contact plug structure 556 on the second region II of the substrate 600. The fourth contact plug structure 830 may include a fourth metal nitride pattern 810 and a fourth metal pattern 820 sequentially stacked on the fourth lower wiring 720 and extending through the second lower insulating interlayer 730 and the first to fourth insulating interlayers 180, 230, 330 and 450. In an example embodiment of the present inventive concept, a lower surface of the fourth contact plug structure 830 may be lower than a lower surface of the second contact plug structure 554, and an upper surface of the fourth contact plug structure 830 may be substantially coplanar with an upper surface of the second contact plug structure 554.

As described above, although the present inventive concept has been described with reference to example embodiments, those skilled in the art will readily appreciate that many modifications are possible in the example embodiments without departing from the spirit and scope of the present inventive concept as defined by the appended claims.

What is claimed is:

1. A method of manufacturing a vertical memory device, the method comprising:
   forming a circuit pattern on a substrate;
   forming a first insulating interlayer to cover the circuit pattern;
   forming first gate electrodes spaced apart from each other on the first insulating interlayer in a vertical direction substantially perpendicular to an upper surface of the substrate, the first gate electrodes being covered by a second insulating interlayer and including a low electrical resistance metal and a metal nitride;
   forming first contact holes extending through the second insulating interlayer in the vertical direction to expose portions of the first gate electrodes, respectively;
   forming a polysilicon layer on the exposed portions of the first gate electrodes, sidewalls of the first contact holes, and the second insulating interlayer;
   forming a barrier layer on the polysilicon layer and the second insulating interlayer;
   transforming a portion of the barrier layer and the polysilicon layer into a metal silicide layer; and
   forming first metal patterns to fill remaining portions of the first contact holes,
   wherein at least a portion of the metal silicide layer is in direct contact with the second insulating interlayer and a corresponding one of the first gate electrodes, and
   wherein a lower surface of the metal silicide layer is lower than an upper surface of the corresponding one of the first gate electrodes.

2. The method of claim 1, wherein the forming of the barrier layer comprises:
   forming a metal layer on the polysilicon layer and the second insulating interlayer; and
   forming a first metal nitride layer on the metal layer,
   wherein a portion of the metal layer and the polysilicon layer are transformed into the metal silicide layer.

3. The method of claim 2, wherein remaining of the metal layer is transformed into a second metal nitride layer.

4. The method of claim 3, wherein
   the metal layer includes titanium,
   the first and second metal nitride layers include titanium nitride, wherein the remaining of the metal layer being transformed into the second metal nitride layer is merged with the first metal nitride layer formed on the metal layer, and
   the metal silicide layer includes titanium silicide.

5. The method of claim 1, wherein the substrate includes a cell region and a peripheral circuit region, and
   wherein the first gate electrodes are on the cell region of the substrate,
   wherein further comprises:
   after forming a polysilicon layer, forming a second contact hole extending through the first and second insulating interlayers in the vertical direction on the peripheral region of the substrate to expose a portion of the circuit pattern.

6. The method of claim 5, wherein
   the forming of the second contact hole comprises:
   forming an amorphous carbon layer (ACL) on the polysilicon layer; and
   etching the polysilicon layer and the first and second insulating interlayers using the ACL as an etching mask, and
   after the forming of the second contact hole, the method further comprises:
   removing the ACL by an ashing process using oxygen plasma.

7. The method of claim 6, further comprising:
   after the removing of the ACL, performing an etching process for removing a residue remaining in the second contact hole, wherein a portion of the polysilicon layer on each of the portions of the first gate electrodes exposed by the first contact holes, respectively, is partially removed to have a thickness smaller than that of a portion of the polysilicon layer on each of the sidewalls of the first contact holes.

8. The method of claim 5, wherein the barrier layer is also formed on the exposed portion of the circuit pattern and a sidewall of the second contact hole, and
wherein second metal patterns are formed to fill remaining portions of the second contact holes, respectively.

9. The method of claim 1, wherein
the forming of the first contact holes comprises:
forming an amorphous carbon layer (ACL) on the second insulating interlayer; and
etching the second insulating interlayer using the ACL as an etching mask, and
after the forming of the first contact holes, the method further comprises:
removing the ACL by an ashing process using oxygen plasma; and
removing a residue remaining on the portions of the first gate electrodes exposed by the first contact holes by a wet etching process.

10. The method of claim 1, wherein the forming of the first gate electrodes comprises:
alternately and repeatedly forming a sacrificial layer and an insulation layer on the substrate;
removing the sacrificial layers to form gaps between the insulation layers; and
forming the first gate electrodes in the gaps, respectively.

11. The method of claim 1, further comprising:
forming a channel to extend through ones of the first gate electrodes.

12. A method of manufacturing a vertical memory device, the method comprising:
forming a circuit pattern on a substrate;
forming a first insulating interlayer to cover the circuit pattern;
forming a gate electrode structure including gate electrodes spaced apart from each other on the first insulating interlayer in a vertical direction substantially perpendicular to an upper surface of the substrate, the gate electrode structure being covered by a second insulating interlayer, and each of the gate electrodes including a first metal pattern comprising a low electrical resistance metal and a first metal nitride pattern covering lower and upper surfaces and a sidewall of the first metal pattern;
forming contact holes extending through the second insulating interlayer in the vertical direction to expose portions of the gate electrodes, respectively; and
forming contact plug structures to fill the contact holes, respectively, each of the contact plug structures including a second metal pattern, a second metal nitride pattern covering a lower surface and a sidewall of the second metal pattern and a second metal silicide pattern covering a lower surface and a sidewall of the second metal nitride pattern,
wherein at least a portion of the second metal silicide pattern of the contact plug structure is in direct contact with the second insulating interlayer and a first metal pattern of a corresponding one of the gate electrodes, and
wherein a lower surface of the second metal silicide pattern of the contact plug structure is lower than an upper surface of the first metal nitride pattern in the corresponding one of the gate electrodes.

13. The method of claim 12, wherein the forming of the contact plug structure comprises:
forming a polysilicon layer on the exposed portions of the gate electrodes, sidewalls of the contact holes, and the second insulating interlayer;
forming a first metal layer on the polysilicon layer;
forming a metal nitride layer on the first metal layer;
transforming the first metal layer and the polysilicon layer into a metal silicide layer;
forming second metal layers to fill remaining portions of the contact holes, respectively; and
planarizing the second metal layer, the metal nitride layer and the metal silicide layer until an upper surface of the second insulating interlayer is exposed to form the second metal pattern, the second metal nitride pattern and the second metal silicide pattern, respectively.

14. The method of claim 12, wherein lower surfaces of the contact holes are higher than lower surfaces of the gate electrodes, respectively.

15. The method of claim 12, wherein the forming of the gate electrode structure comprises:
alternately and repeatedly forming a sacrificial layer and an insulation layer on the substrate;
removing the sacrificial layers to form gaps between the insulation layers; and
forming the gate electrodes in the gaps, respectively.

16. The method of claim 12, further comprising:
forming a channel to extend through ones of the gate electrodes.

17. A method of manufacturing a vertical memory device, the method comprising:
forming a circuit pattern on a substrate including a cell region and a peripheral region;
forming a first insulating interlayer to cover the circuit pattern;
forming a base pattern on a portion of the first insulating interlayer on the cell region of the substrate;
forming a gate electrode structure including gate electrodes spaced apart from each other on the cell region of the substrate in a vertical direction substantially perpendicular to an upper surface of the substrate, the gate electrode structure being covered by a second insulating interlayer on the first insulating interlayer;
forming first contact holes extending through the second insulating interlayer in the vertical direction to expose portions of the gate electrodes, respectively;
forming a polysilicon layer on the exposed portions of the gate electrodes, sidewalls of the first contact holes, and the second insulating interlayer;
forming a second contact hole extending through the first and second insulating interlayers in the vertical direction on the peripheral region of the substrate to expose a portion of the circuit pattern;
forming a barrier layer on the polysilicon layer, the exposed portion of the circuit pattern, a sidewall of the second contact hole, and the second insulating interlayer;
transforming a portion of the barrier layer and the polysilicon layer into a metal silicide layer; and
forming first and second metal patterns to fill remaining portions of the first and second contact holes, respectively.

18. The method of claim 17, wherein the forming of the barrier layer comprises:

forming a metal layer on the polysilicon layer, the exposed portion of the circuit pattern, the sidewall of the second contact hole, and the second insulating interlayer; and forming a first metal nitride layer on the metal layer, wherein a portion of the metal layer and the polysilicon layer are transformed into the metal silicide layer.

19. The method of claim 18, wherein remaining of the metal layer is transformed into a second metal nitride layer.

20. The method of claim 17, wherein the forming of the second contact hole comprises:
  forming an amorphous carbon layer (ACL) on the polysilicon layer; and
  etching the polysilicon layer and the first and second insulating interlayers using the ACL as an etching mask, and after the forming of the second contact hole, the method further comprises:
  removing the ACL by an ashing process using oxygen plasma.

* * * * *